US012563778B2

(12) United States Patent
Chu et al.

(10) Patent No.: US 12,563,778 B2
(45) Date of Patent: Feb. 24, 2026

(54) SEMICONDUCTOR DEVICE AND METHOD OF FABRICATING THE SAME

(71) Applicant: Taiwan Semiconductor Manufacturing Company, Ltd., Hsinchu (TW)

(72) Inventors: Yi-Cheng Chu, Chiayi (TW); Chien-Hua Huang, Miaoli County (TW); Yu-Ming Lin, Hsinchu (TW); Chung-Te Lin, Tainan (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 535 days.

(21) Appl. No.: 18/161,855

(22) Filed: Jan. 30, 2023

(65) Prior Publication Data

US 2024/0128378 A1 Apr. 18, 2024

Related U.S. Application Data

(60) Provisional application No. 63/415,662, filed on Oct. 13, 2022.

(51) Int. Cl.
*H10D 30/67* (2025.01)
*H10D 30/01* (2025.01)

(52) U.S. Cl.
CPC ..... *H10D 30/6732* (2025.01); *H10D 30/0316* (2025.01)

(58) Field of Classification Search
CPC ...................... H10D 30/6732; H10D 30/0316
See application file for complete search history.

(56) References Cited

U.S. PATENT DOCUMENTS

2020/0357929 A1* 11/2020 Le ....................... H10D 30/6755
2024/0006521 A1* 1/2024 Lin .................... H10D 30/6729

* cited by examiner

*Primary Examiner* — Peter M Albrecht
(74) *Attorney, Agent, or Firm* — JCIPRNET

(57) ABSTRACT

A semiconductor device includes a first transistor and a protection structure. The first transistor includes a gate electrode, a gate dielectric disposed on the gate electrode, and a channel layer disposed on the gate dielectric. The protection structure is laterally surrounding the gate electrode, the gate dielectric and the channel layer of the first transistor. The protection structure includes a first capping layer and a dielectric portion. The first capping layer is laterally surrounding and contacting the gate electrode, the gate dielectric and the channel layer of the first transistor. The dielectric portion is disposed on the first capping layer and laterally surrounding the first transistor.

20 Claims, 22 Drawing Sheets

SEMICONDUCTOR DEVICE AND METHOD OF FABRICATING THE SAME

CROSS-REFERENCE TO RELATED APPLICATION

This application claims the priority benefit of U.S. provisional application Ser. No. 63/415,662, filed on Oct. 13, 2022. The entirety of the above-mentioned patent application is hereby incorporated by reference herein and made a part of this specification.

BACKGROUND

The semiconductor integrated circuit (IC) industry has experienced a fast-paced growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
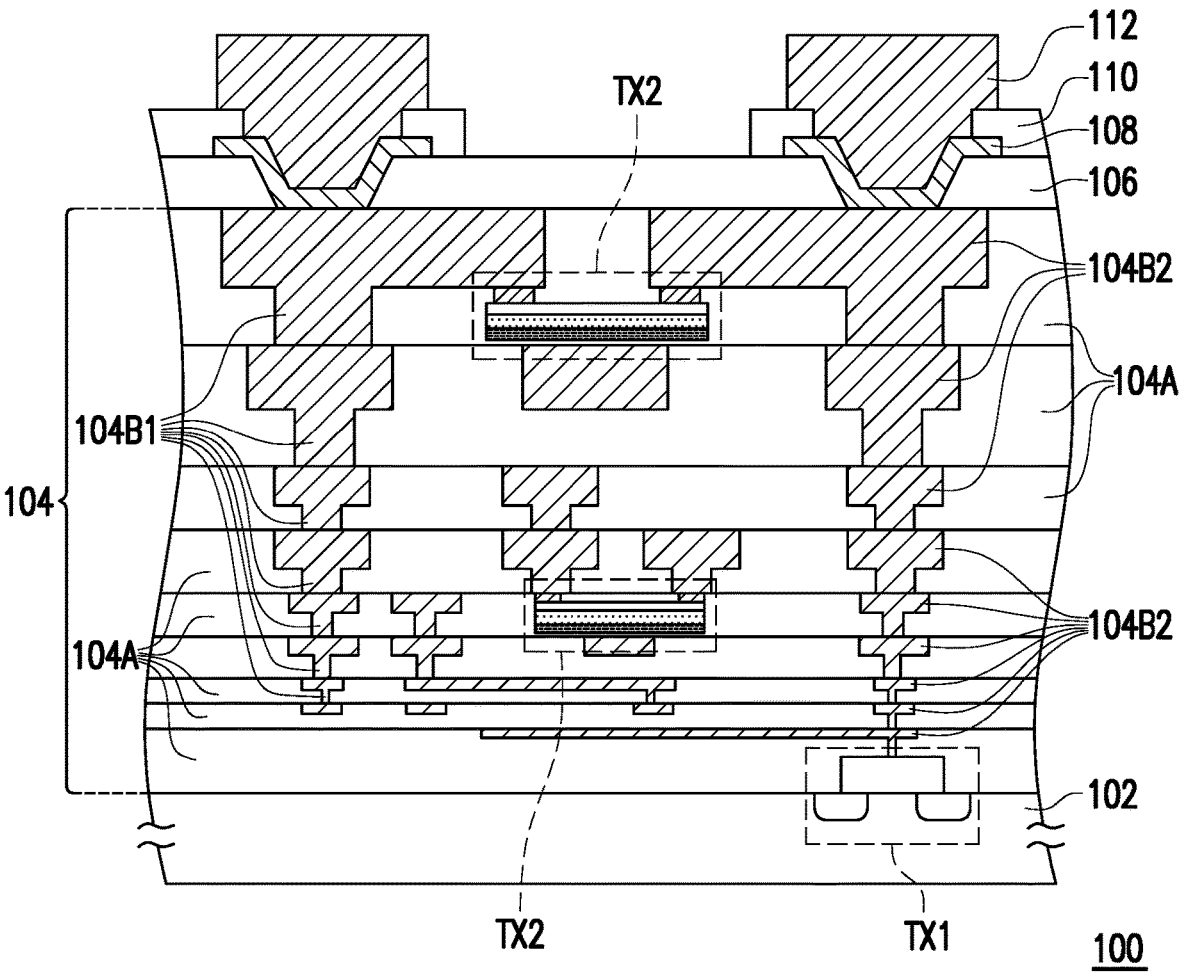
FIG. 1 is a schematic cross-sectional view of a semiconductor device in accordance with some embodiments of the disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the formation of conventional back-end-of-line (BEOL) thin film transistors, the back-gate electrode material generally needs to be patterned through lithography processes, and planarized through chemical-mechanical polishing (CMP) processes. However, due to metal grain effect and galvanic effect (barrier erosion) at the back-gate corner, and due to the metal-to-oxide removal rate difference in nature, the patterned back-gate top surface cannot be extremely flat after CMP. Furthermore, due to the uneven top surface of the back-gate, the evenness of the high-k dielectric material and channel material formed on the back-gate will also be affected. As the flatness or roughness of the back-gate, high-k dielectric and channel layers in the transistor extremely correlates to its electrical performance and reliability, it is important to control the flatness or roughness of these layers. In accordance with some embodiments of the present disclosure, a thin film transistor having back-gate, high-k dielectric and channel layers with ideal flatness and low roughness is formed.

FIG. 1 is a schematic cross-sectional view of a semiconductor device in accordance with some embodiments of the disclosure. Referring to FIG. 1, the semiconductor device 100 includes a substrate 102, an interconnection layer 104, a passivation layer 106, a post-passivation layer 110, a plurality of conductive pads 108, and a plurality of conductive terminals 112. In some embodiments, the substrate 102 is made of elemental semiconductor materials, such as crystalline silicon, diamond, or germanium; compound semiconductor materials, such as silicon carbide, gallium arsenic, indium arsenide, or indium phosphide; or alloy semiconductor materials, such as silicon germanium, silicon germanium carbide, gallium arsenic phosphide, or gallium indium phosphide. The substrate 102 may be a bulk silicon substrate, a silicon-on-insulator (SOI) substrate, or a germanium-on-insulator (GOI) substrate.

In some embodiments, the substrate 102 includes various doped regions depending on circuit requirements (e.g., p-type semiconductor substrate or n-type semiconductor substrate). In some embodiments, the doped regions are doped with p-type dopants or n-type dopants. For example, the doped regions may be doped with p-type dopants, such as boron or $BF_2$; n-type dopants, such as phosphorus or arsenic; and/or combinations thereof. In some embodiments, these doped regions serve as source/drain regions of a transistor TX1, which is formed over the substrate 102. Depending on the types of the dopants in the doped regions, the transistor TX1 may be referred to as n-type transistor or p-type transistor. In some embodiments, the transistor TX1 further includes a metal gate and a channel under the metal gate. The channel is located between the source region and the drain region to serve as a path for electron to travel when the transistor TX1 is turned on. On the other hand, the metal gate is located above the substrate 102 and is embedded in the interconnection layer 104. In some embodiments, the transistor TX1 is formed using suitable Front-end-of-line (FEOL) process. For simplicity, one transistor TX1 is shown in FIG. 1. However, it should be understood that more than one transistor TX1 may be presented depending on the application of the semiconductor device 100. When multiple transistors TX1 are presented, these transistors TX1 may be separated by shallow trench isolation (STI; not shown) located between two adjacent transistors TX1.

As illustrated in FIG. 1, the interconnection layer 104 is formed over the substrate 102. In some embodiments, the interconnection layer 104 includes a plurality of dielectric layers 104A and a plurality of conductive layers (104B1, 104B2) alternately stacked up along a build-up direction. The interconnection layer 104 further includes a plurality of transistors TX2 located in between the plurality of dielectric layers 104A. In some embodiments, the plurality of transistors TX2 may form transistor arrays (not shown) at different levels of the interconnection layer 104.

In some embodiments, the conductive layers (104B1, 104B2) of the interconnection layer 104 include conductive vias 104B1 and conductive patterns 104B2 embedded in the dielectric layers 104A. In some embodiments, the conductive patterns 104B2 located at different level heights are connected to one another through the conductive vias 104B1. In other words, the conductive patterns 104B2 are electrically connected to one another through the conductive vias 104B1. In some embodiments, the bottommost conductive vias 104B1 are connected to the transistor TX1. For example, the bottommost conductive vias 104B1 are connected to the metal gate, which is embedded in the bottommost dielectric layer 104A, of the transistor TX1. In other words, the bottommost conductive vias 104B1 establish electrical connection between the transistor TX1 and the conductive patterns 104B2 of the interconnection layer 104. As illustrated in FIG. 1, the bottommost conductive via 104B1 is connected to the metal gate of the transistor TX1. It should be noted that in some alternative cross-sectional views, other bottommost conductive vias 104B1 are also connected to source/drain regions of the transistor TX1. That is, in some embodiments, the bottommost conductive vias 104B1 may be referred to as "contact structures" of the transistor TX1.

In some embodiments, the dielectric layers 104A include materials such as polyimide, epoxy resin, acrylic resin, phenol resin, benzocyclobutene (BCB), polybenzooxazole (PBO), or any other suitable polymer-based dielectric material. Alternatively, the dielectric layers 104A may be formed of oxides or nitrides, such as silicon oxide, silicon nitride, silicon oxycarbide (SiOC) and silicon carbonitride (SiCN), silicon oxycarbonitride (SiOCN), silicon oxynitride (SiON), or silicon carbide (SiC), or the like. The dielectric layers 104A may be formed by suitable fabrication techniques such as spin-on coating, chemical vapor deposition (CVD), plasma-enhanced chemical vapor deposition (PECVD), or the like.

In some embodiments, the conductive layers (104B1, 104B2) include materials such as aluminum, titanium, copper, nickel, tungsten, or alloys thereof. The conductive layers (104B1, 104B2) may be formed by electroplating, deposition, and/or photolithography and etching. In some embodiments, the conductive patterns 104B2 and the underlying conductive vias 104B1 are formed simultaneously. In some other embodiments, the conductive patterns 104B2 and the underlying conductive vias 104B1 may be formed separately. It should be noted that the number of the dielectric layers 104A, the number of the conductive layers (104B1, 104B2) illustrated in FIG. 1 are merely for illustrative purposes, and the disclosure is not limited thereto. In some alternative embodiments, fewer or more layers of the dielectric layers 104A and the conductive layers (104B1, 104B2) may be formed depending on the circuit design.

As illustrated in FIG. 1, the transistors TX2 are embedded in the interconnection layer 104. For example, each transistor TX2 may be embedded in one of the dielectric layers 104A. In some embodiments, the transistors TX2 are electrically connected to the conductive patterns 104B2 through the corresponding conductive vias 104B1. In some embodiments, the transistors TX2 may be arranged as a transistor array (e.g. array of transistors/array of memory cells) in each of the dielectric layers 104A. The formation method and the structure of the transistors TX2 will be described in detail later.

As illustrated in FIG. 1, the passivation layer 106, the conductive pads 108, the post-passivation layer 110, and the conductive terminals 112 are sequentially formed on the interconnection layer 104. In some embodiments, the passivation layer 106 is disposed on the topmost dielectric layer 104A and the topmost conductive layer 104B (conductive pattern 104B2). In some embodiments, the passivation layer 106 has a plurality of openings partially exposing the topmost conductive patterns 104B2. In some embodiments, the passivation layer 106 is a silicon oxide layer, a silicon nitride layer, a silicon oxy-nitride layer, or a dielectric layer formed by other suitable dielectric materials. The passivation layer 106 may be formed by suitable fabrication techniques such as (high-density plasma chemical vapor deposition) HDP-CVD, PECVD, or the like.

In some embodiments, the conductive pads 108 are formed over the passivation layer 106. In some embodiments, the conductive pads 108 extend into the openings of the passivation layer 106 to be in direct contact with the topmost conductive patterns 104B2. That is, the conductive pads 108 are physically and electrically connected to the interconnection layer 104. In some embodiments, the conductive pads 108 include aluminum pads, titanium pads, copper pads, nickel pads, tungsten pads, or other suitable metal pads. The conductive pads 108 may be formed by, for example, electroplating, deposition, and/or photolithography and etching. It should be noted that the number and the shape of the conductive pads 108 illustrated in FIG. 1 are merely for illustrative purposes, and the disclosure is not limited thereto. In some alternative embodiments, the number and the shape of the conductive pads 108 may be adjusted based on demand.

In some embodiments, the post-passivation layer 110 is formed over the passivation layer 106 and the conductive pads 108. In some embodiments, the post-passivation layer 110 is formed on the conductive pads 108 to protect the conductive pads 108. In some embodiments, the post-passivation layer 110 has a plurality of contact openings partially exposing each conductive pad 108. The post-passivation layer 110 may be a polyimide layer, a PBO layer, or a dielectric layer formed by other suitable polymers. In some embodiments, the post-passivation layer 110 is formed by suitable fabrication techniques such as HDP-CVD, PECVD, or the like.

As further illustrated in FIG. 1, the conductive terminals 112 are formed over the post-passivation layer 110 and the conductive pads 108. In some embodiments, the conductive terminals 112 extend into the contact openings of the post-passivation layer 110 to be in direct contact with the corresponding conductive pad 108. That is, the conductive terminals 112 are electrically connected to the interconnection layer 104 through the conductive pads 108. In some embodiments, the conductive terminals 112 are conductive pillars, conductive posts, conductive balls, conductive bumps, or the like. In some embodiments, a material of the conductive terminals 112 includes a variety of metals, metal alloys, or metals and mixture of other materials. For example, the conductive terminals 112 may be made of aluminum, titanium, copper, nickel, tungsten, tin, and/or alloys thereof. The conductive terminals 112 are formed by, for example, deposition, electroplating, screen printing, or other suitable methods. In some embodiments, the conductive terminals 112 are used to establish electrical connection with other components (not shown) subsequently formed or provided. Up to here, a semiconductor device 100 in accordance with some embodiments of the present disclosure is accomplished.

As illustrated in FIG. 1, a plurality of transistors TX2 are embedded in the interconnection layer 104 in between the dielectric layers 104A. The formation method and the structure of the transistors TX2 in a transistor array will be described in more detail by referring to FIG. 2A to FIG. 2H shown below.

Figure 2A:
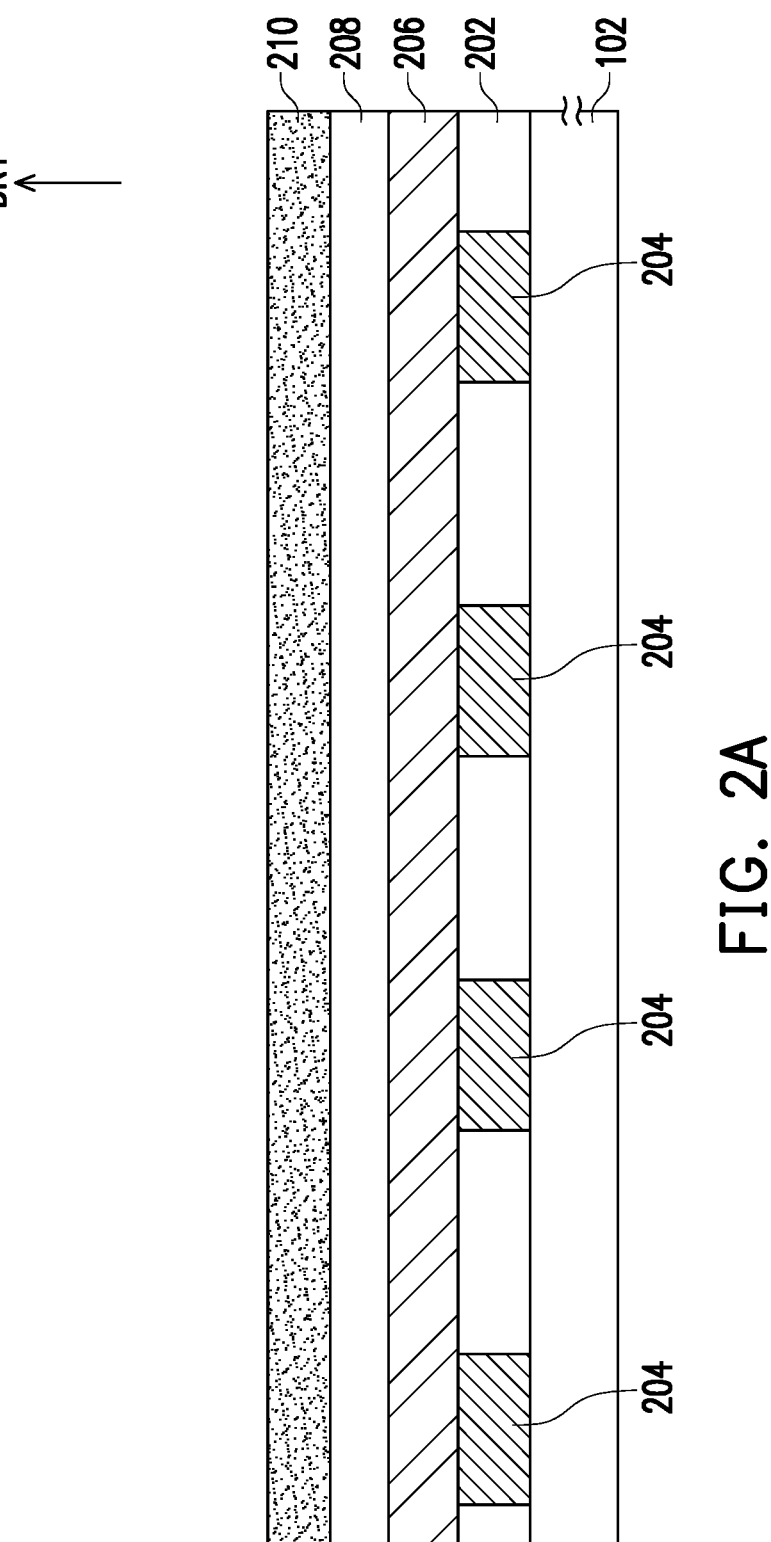
FIG. 2A to FIG. 2H are schematic cross-sectional views illustrating various stages in a method of fabricating a transistor array in the semiconductor device shown in FIG. 1 according to some embodiments of the disclosure.

FIG. 2A to FIG. 2H are schematic cross-sectional views illustrating various stages in a method of fabricating a transistor array in the semiconductor device shown in FIG. 1 according to some embodiments of the disclosure. Referring to FIG. 2A, in some embodiments, a bottom dielectric 202 and a contact structure 204 are formed over the substrate 102. The bottom dielectric 202 is laterally surrounding the contact structure 204. In some embodiments, the bottom dielectric 202 may correspond to any dielectric layers 104A of the interconnection layer 104, while the contact structure 204 may correspond to any conductive layers (104B1, 104B2) of the interconnection layer 104. In other words, in some embodiments, the bottom dielectric 202 may be formed directly on the substrate 102 and contacting the substrate 102. Alternatively, there may be a plurality of dielectric layers 104A located in between the bottom dielectric 202 and the substrate 102. In some embodiments, the bottom dielectric 202 and the contact structure 204 are formed by the same methods and of the same materials of forming the dielectric layers 104A and the conductive layers (104B1, 104B2), thus their details will not be repeated herein.

After forming the bottom dielectric 202 and the contact structure 204, a gate electrode 206 (or back-gate/bottom gate), a gate dielectric 208 (or high-k dielectric), and a channel layer 210 are sequentially formed on the bottom dielectric 202 over the substrate 102 in the build-up direction DR1. For example, the gate electrode 206 may be electrically connected to the contact structure 204 located underneath. In some embodiments, the gate electrode 206 include metal materials such as titanium nitride (TiN), tantalum nitride (TaN), tantalum (Ta), copper (Cu), cobalt (Co), molybdenum (Mo), ruthenium (Ru), tungsten (W), gold (Au), silver (Ag), tungsten carbon nitride (WCN), combinations thereof, or the like. In some embodiments, the gate dielectric 208 are high-k dielectrics having a dielectric constant higher than 4, greater than about 12, greater than about 16, or even greater than about 20. For example, the gate dielectric 208 include materials such as aluminum oxide ($AlO_x$), yttrium oxide ($Y_2O_x$), yttrium titanate ($Y_2TiO_x$), ytterbium oxide ($Yb_2O_x$), lanthanum oxide ($La_2O_x$), tantalum oxide ($Ta_2O_x$), titanium oxide ($TiO_x$), hafnium oxide ($HfO_x$), zirconium oxide ($ZrO_x$), aluminum nitride (AlN), or the like. Furthermore, the channel layer 210 may be formed of amorphous silicon, polysilicon, zinc oxide (ZnO), indium-gallium-zinc oxide (InGaZnO), indium tin oxide (ITO), or the like.

In the exemplary embodiment, the gate electrode 206, the gate dielectric 208, and the channel layer 210 are formed by any suitable film deposition techniques such as physical vapor deposition (PVD), chemical vapor deposition (CVD), atomic layer deposition (ALD), electroplating, electroless plating, or the like. In some embodiments, the gate electrode 206 is formed directly on the bottom dielectric 202 without forming an etch-stop layer therebetween. In some embodiments, if the deposited gate electrode 206 has a deposition roughness of 10A or less, then the gate dielectric 208 is directly formed on the gate electrode 206 without performing any planarization step (e.g. CMP) on the gate electrode 206. In certain embodiments, the channel layer 210 is directly formed on the gate dielectric 208 to contact the gate dielectric 208. By forming the gate electrode 206, the gate dielectric 208, and the channel layer 210 by direct film stacking, the gate electrode 206, the gate dielectric 208, and the channel layer 210 may have top surfaces with ideal flatness and low roughness (Ra<10 Å).

Figure 2B:
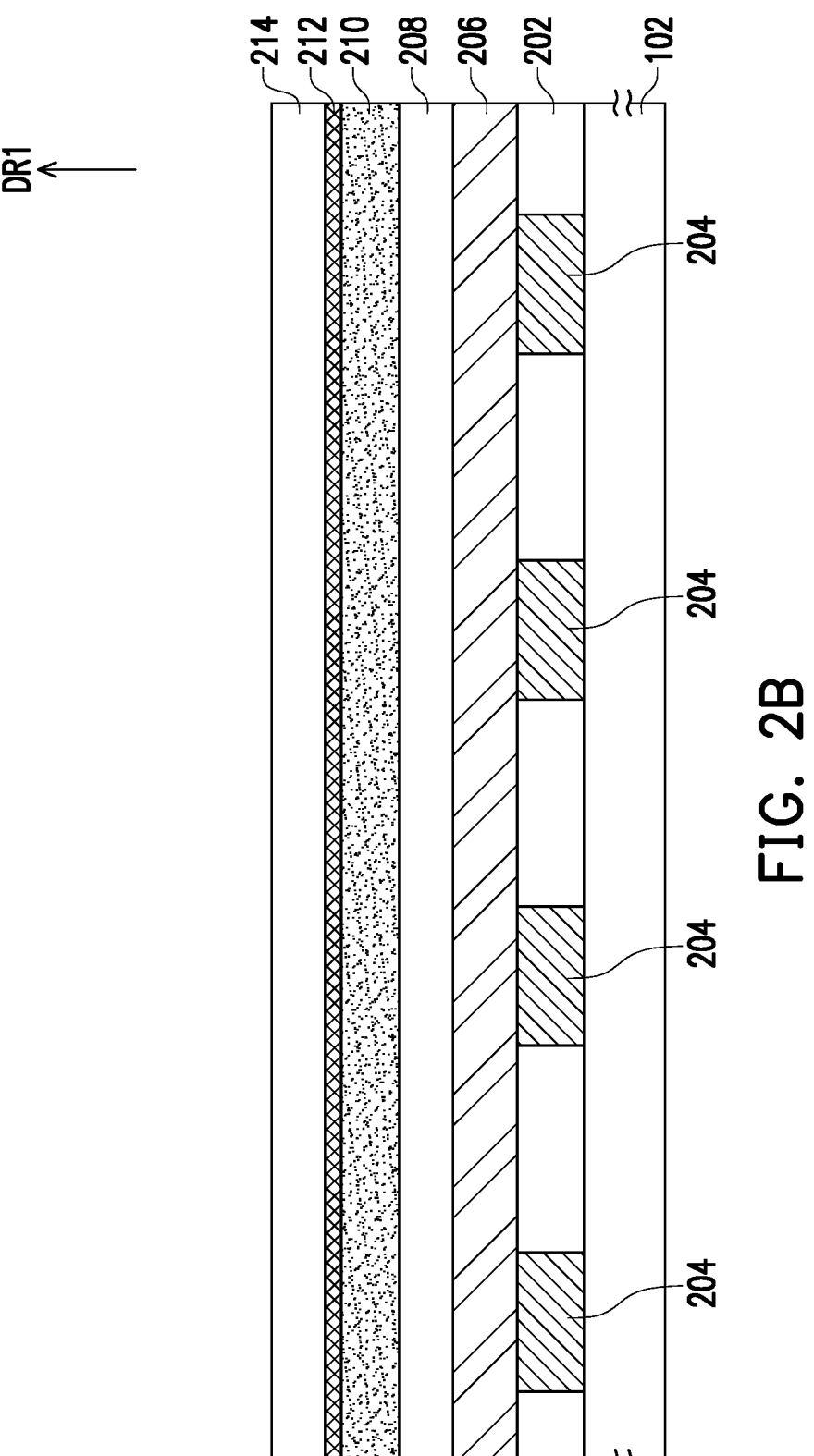

Referring to FIG. 2B, in a subsequent step, a capping layer 212 (or auxiliary capping layer) is directly formed on the channel layer 210, and a dielectric layer 214 is directly formed on the capping layer 212. In some embodiments, the capping layer 212 is used for preventing hydrogen ion intake into the transistor, and for blocking moisture absorption. In some embodiments, the capping layer 212 is made of materials such as aluminum oxide ($AlO_x$), yttrium oxide ($Y_2O_x$), yttrium titanate ($Y_2TiO_x$), ytterbium oxide ($Yb_2O_x$), lanthanum oxide ($La_2O_x$), tantalum oxide ($Ta_2O_x$), titanium oxide ($TiO_x$), hafnium oxide ($HfO_x$), zirconium oxide ($ZrO_x$), aluminum nitride (AlN), silicon oxide ($SiO_x$), silicon nitride (SiN), silicon oxycarbide (SiOC), silicon carbonitride (SiCN), silicon oxycarbonitride (SiOCN), silicon oxynitride (SiON), silicon carbide (SiC) or the like. In some embodiments, the dielectric layer 214 is made of dielectric materials such as silicon oxide ($SiO_x$), silicon nitride (SiN), silicon oxycarbide (SiOC), silicon carbonitride (SiCN), silicon oxycarbonitride (SiOCN), silicon oxynitride (SiON), silicon carbide (SiC) or the like. Furthermore, the capping layer 212 and the dielectric layer 214 may be formed by any suitable film deposition techniques such as physical vapor deposition (PVD), chemical vapor deposition (CVD), atomic layer deposition (ALD), electroplating, electroless plating, or the like.

Figure 2C:
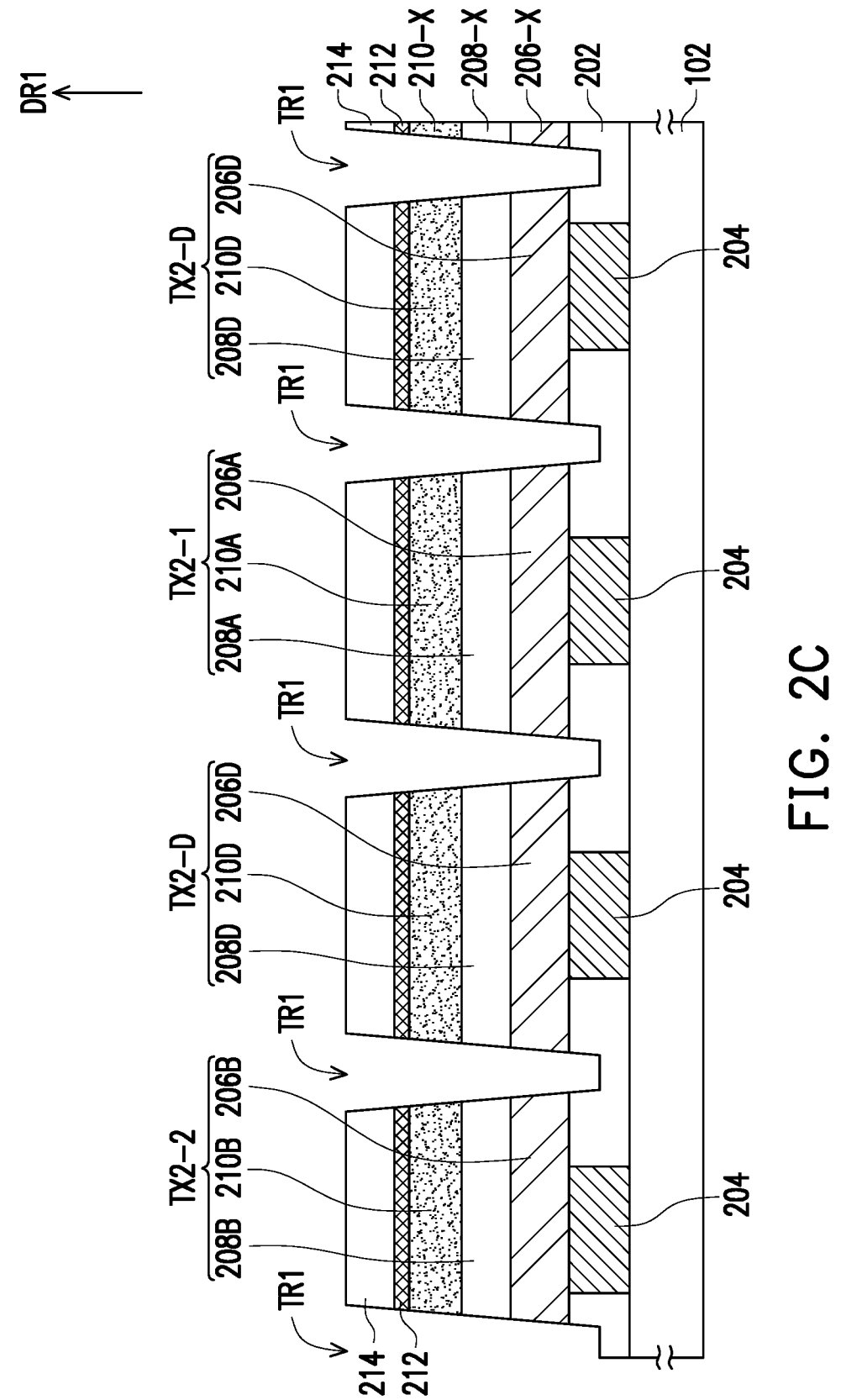

Referring to FIG. 2C, after forming the capping layer 212 and the dielectric layer 214, the gate electrode 206, the gate dielectric 208, the channel layer 210 along with the capping layer 212 and the dielectric layer 214 are patterned to form trenches TR1. For example, the trenches TR1 are formed to penetrate through the gate electrode 206, the gate dielectric 208, the channel layer 210, the capping layer 212 and the dielectric layer 214. In some embodiments, the bottom dielectric 202 is also partially removed to form the trenches TR1. After forming the trenches TR1, a first transistor TX2-1, a second transistor TX2-2 and dummy transistors TX2-D may be defined. For example, two dummy transistors TX2-D may be located on two opposing sides of the first transistor TX2-1, while one of the dummy transistors TX2-D is located in between the first transistor TX2-1 and the second transistor TX2-2. The first transistor TX2-1, the second transistor TX2-2 and the dummy transistors TX2-D may correspond to the plurality of transistors TX2 shown in the semiconductor device 100 of FIG. 1.

In the exemplary embodiment, the first transistor TX2-1 includes a gate electrode 206A disposed over the contact structure 204, a gate dielectric 208A disposed on the gate electrode 206A, and a channel layer 210A disposed on the gate dielectric 208A. In some embodiments, the second transistor TX2-2 includes a gate electrode 206B disposed over the contact structure 204, a gate dielectric 208B disposed on the gate electrode 206B, and a channel layer 210B disposed on the gate dielectric 208B. Furthermore, the dummy transistors TX2-D include a dummy gate electrode 206D disposed over the contact structure 204, a dummy gate dielectric 208D disposed on the dummy gate electrode 206D, and a dummy channel layer 210D disposed on the gate dielectric 208D.

In some embodiments, sidewalls of the gate electrodes 206A, 206B and sidewalls of the dummy gate electrodes 206D are respectively aligned with sidewalls of the gate dielectrics 208A, 208B, and sidewalls of the dummy gate dielectric 208D. Furthermore, sidewalls of the gate electrodes 206A, 206B and sidewalls of the dummy gate electrodes 206D are respectively aligned with sidewalls of the channel layers 210A, 210B, and sidewalls of the dummy channel layer 210D. In some embodiments, sidewalls of the capping layer 212 and the dielectric layer 214 may be aligned with sidewalls of the first transistor TX2-1, the second transistor TX2-2 and the dummy transistors TX2-D respectively.

In some embodiments, when patterning the gate electrode 206, the gate dielectric 208, the channel layer 210, the capping layer 212 and the dielectric layer 214 to form the trenches TR1, a gate material portion 206-X, a gate dielectric portion 208-X and a channel material portion 210-X may be retained at a boundary of the semiconductor device 100. For example, the gate dielectric portion 208-X is disposed on the gate material portion 206-X, and the channel material portion 210-X is disposed on the gate dielectric portion 208-X. In some embodiments, sidewalls of the gate material portion 206-X, the gate dielectric portion 208-X and the channel material portion 210-X are aligned with sidewalls of the substrate 102. Furthermore, in some embodiments, a portion of the capping layer 212 and a portion of the dielectric layer 214 may be retained at the boundary of the semiconductor device 100. For example, sidewalls of the portion of the capping layer 212 and the portion of the dielectric layer 214 may be aligned with sidewalls of the gate material portion 206-X, the gate dielectric portion 208-X and the channel material portion 210-X.

Figure 2D:
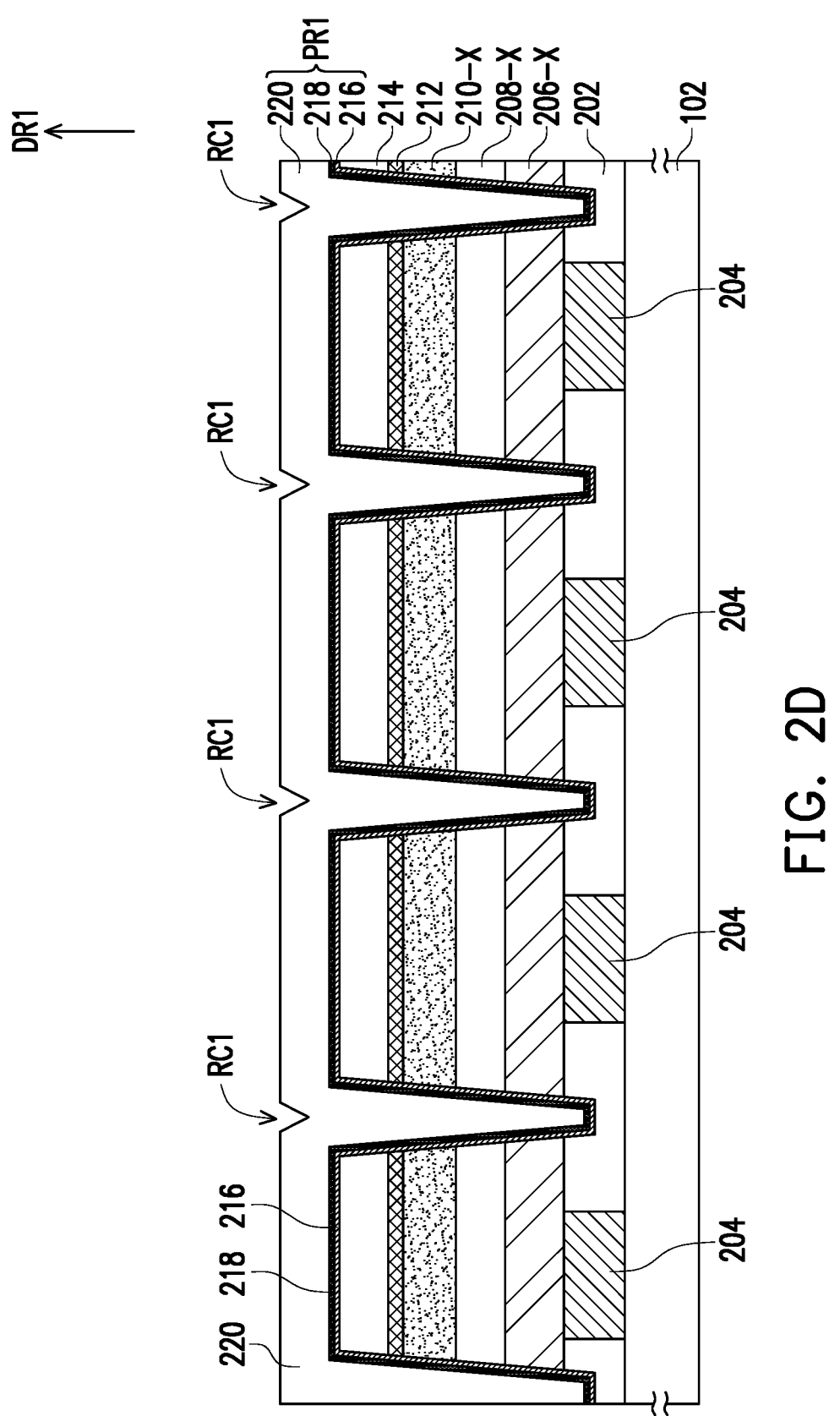

Referring to FIG. 2D, in a subsequent step, a protection structure PR1 is formed inside the trenches TR1 to laterally surround the first transistor TX2-1, the second transistor TX2-2 and the dummy transistors TX2-D. For example, the protection structure PR1 is formed to laterally surround the gate electrodes 206A, 206B, the gate dielectrics 208A, 208B, and the channel layers 210A, 210B of the first transistor TX2-1 and second transistor TX2-2 respectively. Furthermore, protection structure PR1 is formed to laterally surround the dummy gate electrodes 206D, the dummy gate dielectrics 208D and the dummy channel layers 210D.

In some embodiments, forming the protection structure PR1 in the trenches TR1 includes sequentially forming a first capping layer 216, a second capping layer 218 and a dielectric portion 220 in the trenches TR1. For example, the first capping layer 216 is conformally formed in the trenches TR1 to laterally surround and contact the gate electrodes 206A, 206B, the gate dielectrics 208A, 208B, and the channel layers 210A, 210B of the first transistor TX2-1 and second transistor TX2-2. The first capping layer 216 is further formed to laterally surround and contact the dummy transistors TX2-D. In some embodiments, the second capping layer 218 is conformally formed in the trenches TR1 over the first capping layer 216, to laterally surround the first transistor TX2-1, the second transistor TX2-2 and the dummy transistors TX2-D. Furthermore, the dielectric portion 220 is formed on the second capping layer 218 to fill up the trenches TR1 and to laterally surround the first transistor TX2-1, the second transistor TX2-2 and the dummy transistors TX2-D. In some embodiments, the dielectric portion 220 may correspond to any of the dielectric layers 104A illustrated in FIG. 1. In some embodiments, the top surface of the dielectric portion 220 include a plurality of recessed portions RC1, which are removed in a subsequent step through planarization processes.

In the exemplary embodiment, the first capping layer 216 and the second capping layer 218 are made of materials such as aluminum oxide ($AlO_x$), yttrium oxide ($Y_2O_x$), yttrium titanate ($Y_2TiO_x$), ytterbium oxide ($Yb_2O_x$), lanthanum oxide ($La_2O_x$), tantalum oxide ($Ta_2O_x$), titanium oxide ($TiO_x$), hafnium oxide ($HfO_x$), zirconium oxide ($ZrO_x$), aluminum nitride (AlN), silicon oxide ($SiO_x$), silicon nitride (SiN), silicon oxycarbide (SiOC), silicon carbonitride (SiCN), silicon oxycarbonitride (SiOCN), silicon oxynitride (SiON), silicon carbide (SiC) or the like. The first capping layer 216 and the second capping layer 218 may be made of different materials, and be used for preventing hydrogen ion intake and for blocking moisture absorption respectively. In certain embodiments, the dielectric portion 220 is made of dielectric materials such as silicon oxide ($SiO_x$), silicon nitride (SiN), silicon oxycarbide (SiOC), silicon carbonitride (SiCN), silicon oxycarbonitride (SiOCN), silicon oxynitride (SiON), silicon carbide (SiC) or the like. Furthermore, the first capping layer 216, the second capping layer 218 and the dielectric portion 220 may be formed by any suitable film deposition techniques such as physical vapor deposition (PVD), chemical vapor deposition (CVD), atomic layer deposition (ALD), electroplating, electroless plating, or the like.

Figure 2E:
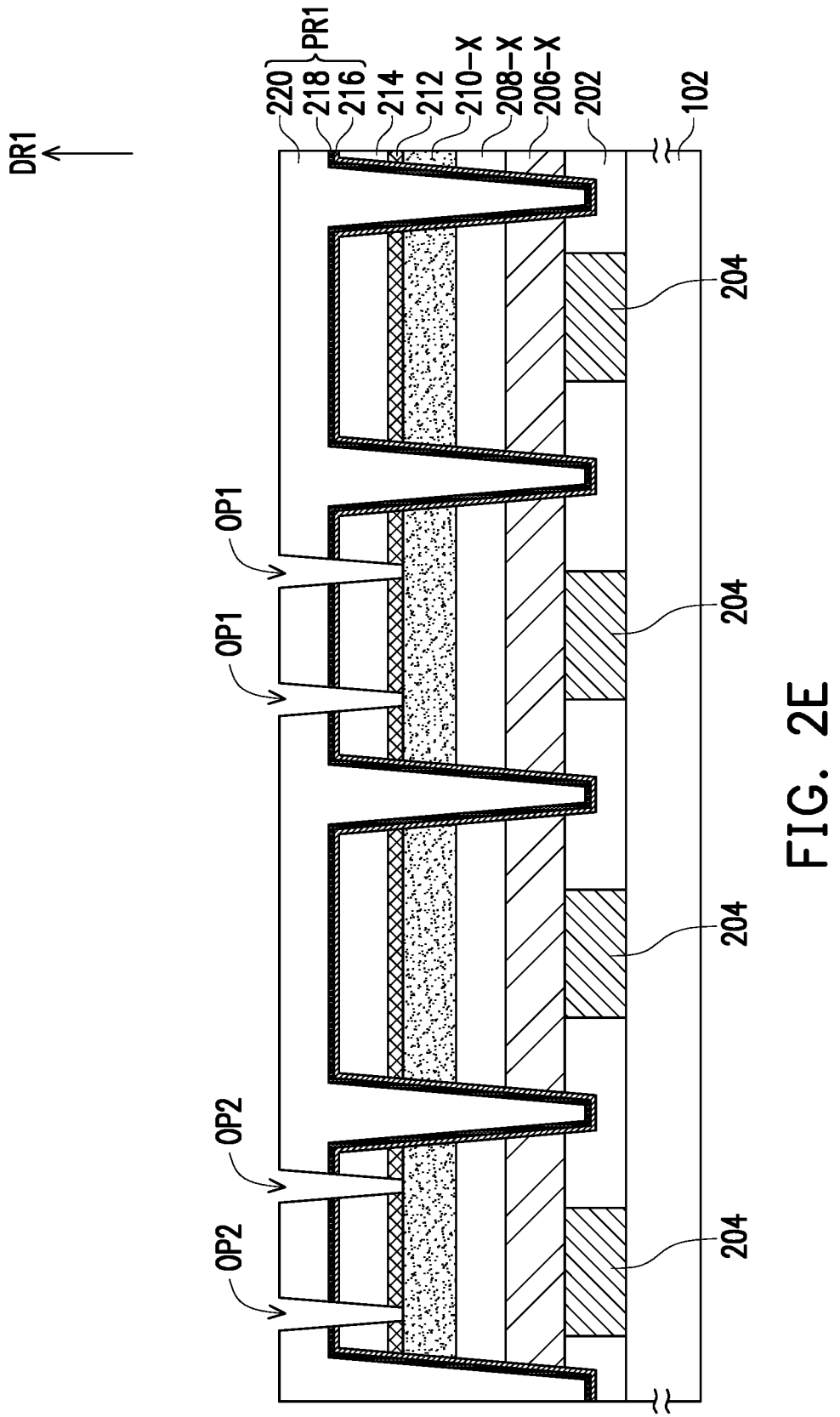

Referring to FIG. 2E, in a subsequent step, the recessed portions RC1 are removed from the dielectric portion 220 through planarization steps. Thereafter, the dielectric portion 220, the second capping layer 218, the first capping layer 216, the dielectric layer 214 and the capping layer 212 are patterned together to form first openings OP1 and second openings OP2. In some embodiments, the first openings OP1 reveal a top surface of the channel layer 210A of the first transistor TX2-1, while the second openings OP2 reveal a top surface of the channel layer 210B of the second transistor TX2-2.

Figure 2F:
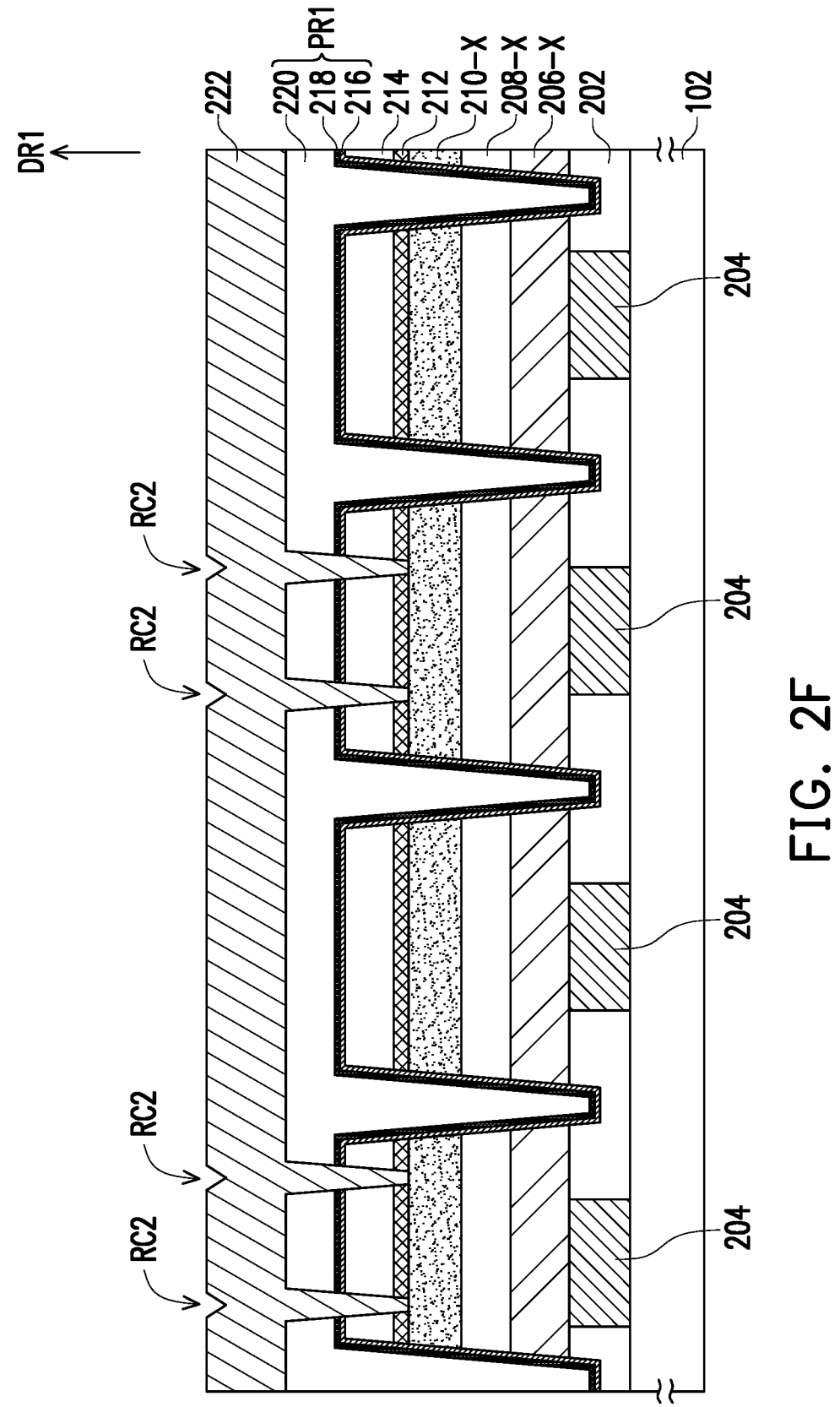

Referring to FIG. 2F, after forming the first openings OP1 and the second openings OP2, a source and drain material 222 is formed in the first openings OP1 and the second openings OP2 and formed over the dielectric portion 220. In some embodiments, the top surface of the source and drain material 222 includes a plurality of recessed portions RC2. For example, the recessed portions RC2 are located at regions overlapped with the first openings OP1 and the second openings OP2, and these recessed portions RC2 are removed in subsequent steps. The source and drain material 222 may be formed of conductive materials including copper, aluminum, tungsten, titanium nitride (TiN), tantalum nitride (TaN), some other conductive materials, or any combinations thereof. In some embodiments, the source and drain material 222 is deposited through ALD, CVD, PVD, or the like.

Figure 2G:
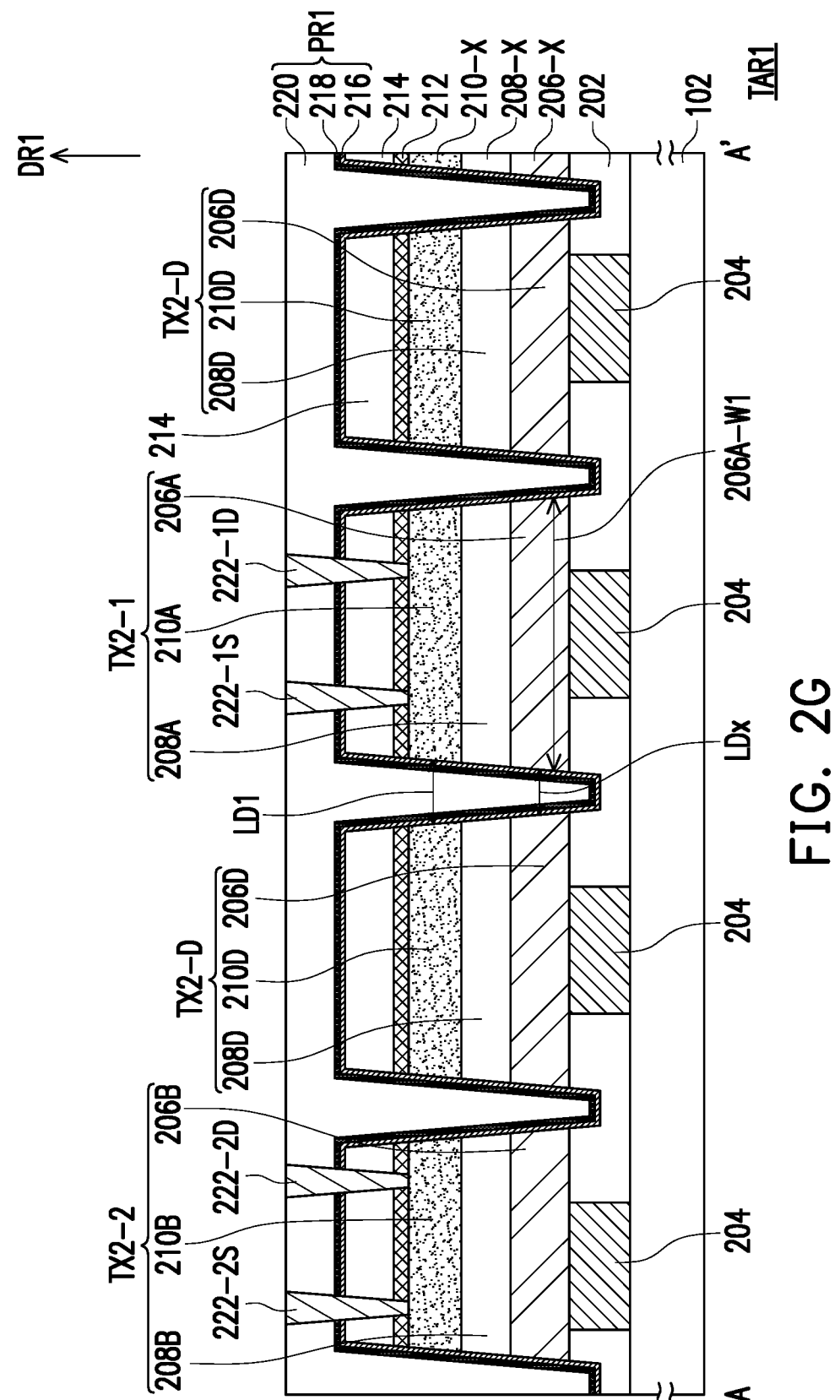
Figure 2H:
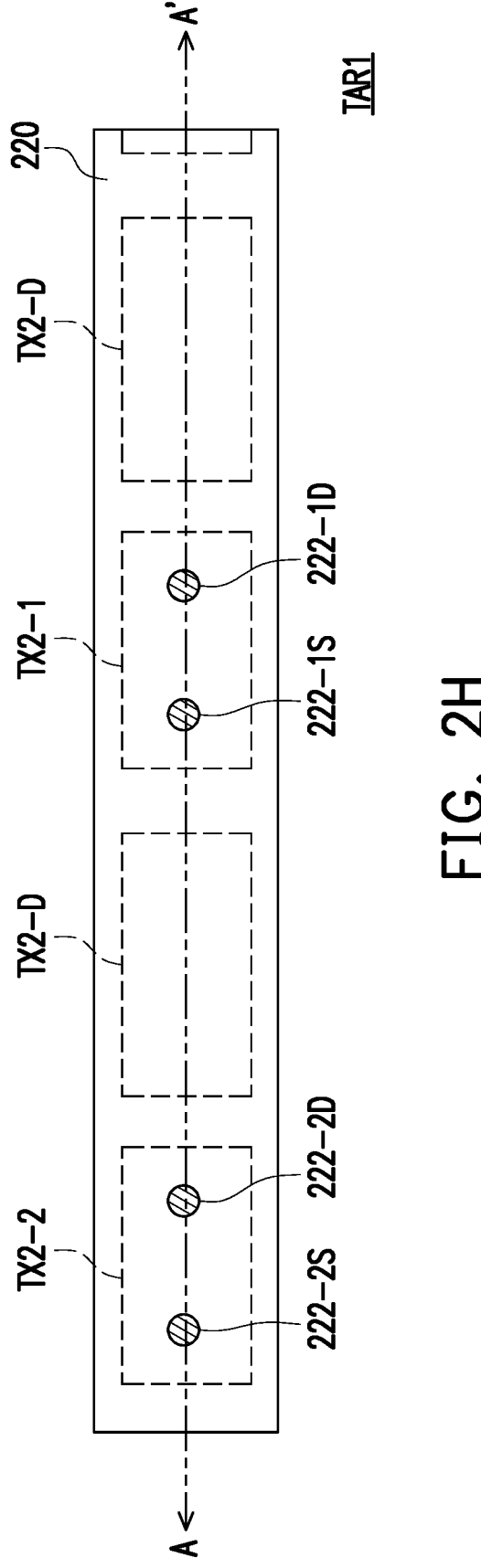

Referring to FIG. 2G and FIG. 2H, in a subsequent step, a planarization step is performed to partially remove the source and drain material 222 to form source and drain electrodes. For example, the source and drain material 222 filled into the first openings OP1 are planarized to form a source electrode 222-1S and a drain electrode 222-1D connected to the channel layer 210A of the first transistor TX2-1. Similarly, the source and drain material 222 filled into the second openings OP2 are planarized to form a source electrode 222-2S and a drain electrode 222-2D connected to the channel layer 210B of the second transistor TX2-2. After forming the source and drain electrodes 222-1S, 222-1D and source and drain electrodes 222-2S, 222-2D, a transistor array TAR1 located in a semiconductor device 100 of FIG. 1 in accordance with some embodiments of the present disclosure may be accomplished.

FIG. 2H is a top view of the transistor array TAR1 shown in FIG. 2G, while FIG. 2G illustrates a cross-sectional view take along lines A-A' of FIG. 2H. As illustrated in FIG. 2G and FIG. 2H, in the transistor array TAR1, the protection structure PR1 is encircling and laterally surrounding the first transistor TX2-1, the second transistor TX2-2 and the dummy transistors TX2-D. In some embodiments, the protection structure PR1 extends over a top surface of the dielectric layer 214. In certain embodiments, the first capping layer 216, the second capping layer 218 and the dielectric portion 220 of the protection structure PR1 may be directly contacting the sidewalls of the source and drain electrodes 222-1S, 222-1D and directly contacting sidewalls of the source and drain electrodes 222-2S, 222-2D.

As further illustrated in FIG. 2G, in some embodiments, a lateral dimension LD1 of the protection structure PR1 increases along the build-up direction DR1. In certain embodiments, the lateral dimension LDx of the protection structure PR1 located in between the gate electrode 206A of the first transistor TX2-1 and the dummy gate electrode 206D of the dummy transistor TX2-D is smaller than a maximum width 206A-W1 of the gate electrode 206A. In certain embodiments, the maximum widths of the gate material portion 206-X, the gate dielectric portion 208-X and the channel material portion 210-X are smaller than the lateral dimension LD1 of the protection structure PR1 along the build-up direction DR1. Furthermore, as illustrated in FIG. 2G and FIG. 2H, a top surface of the dielectric portion 220 of the protection structure PR1 is aligned with top surfaces of the source and drain electrodes 222-1S, 222-1D and aligned with top surface of the source and drain electrodes 222-2S, 222-2D.

In the transistor array TAR1 illustrated in FIG. 2G and FIG. 2H, although one first transistor TX2-1, one second transistor TX2-2 and two dummy transistors TX2-D are illustrated herein, it is noted that the transistor array TAR1 may in fact include a plurality of first transistors TX2-1, a plurality of second transistors TX2-2 and a plurality of dummy transistors TX2-D. Furthermore, in the exemplary embodiment, since the gate electrodes 206A, 206B, the gate dielectrics 208A and 208B, and the channel layers 210A, 210B of the first and second transistors TX2-1, TX2-2 are formed by direct film stacking without performing planarization and lithography steps in between the film stacking steps, the gate electrodes 206A, 206B, the gate dielectrics 208A, 208B, and the channel layers 210A, 210B may have top surfaces with ideal flatness and low roughness (Ra<10 Å). Moreover, the presence of the capping layer 212 and the protection structure PR1 (including the first capping layer 216, the second capping layer 218 and the dielectric portion 220) surrounding the transistors may be used for preventing hydrogen ion intake and for blocking moisture absorption. As such, the semiconductor device 100 including the transistor array TAR1 may have improved performance.

Figure 3A:
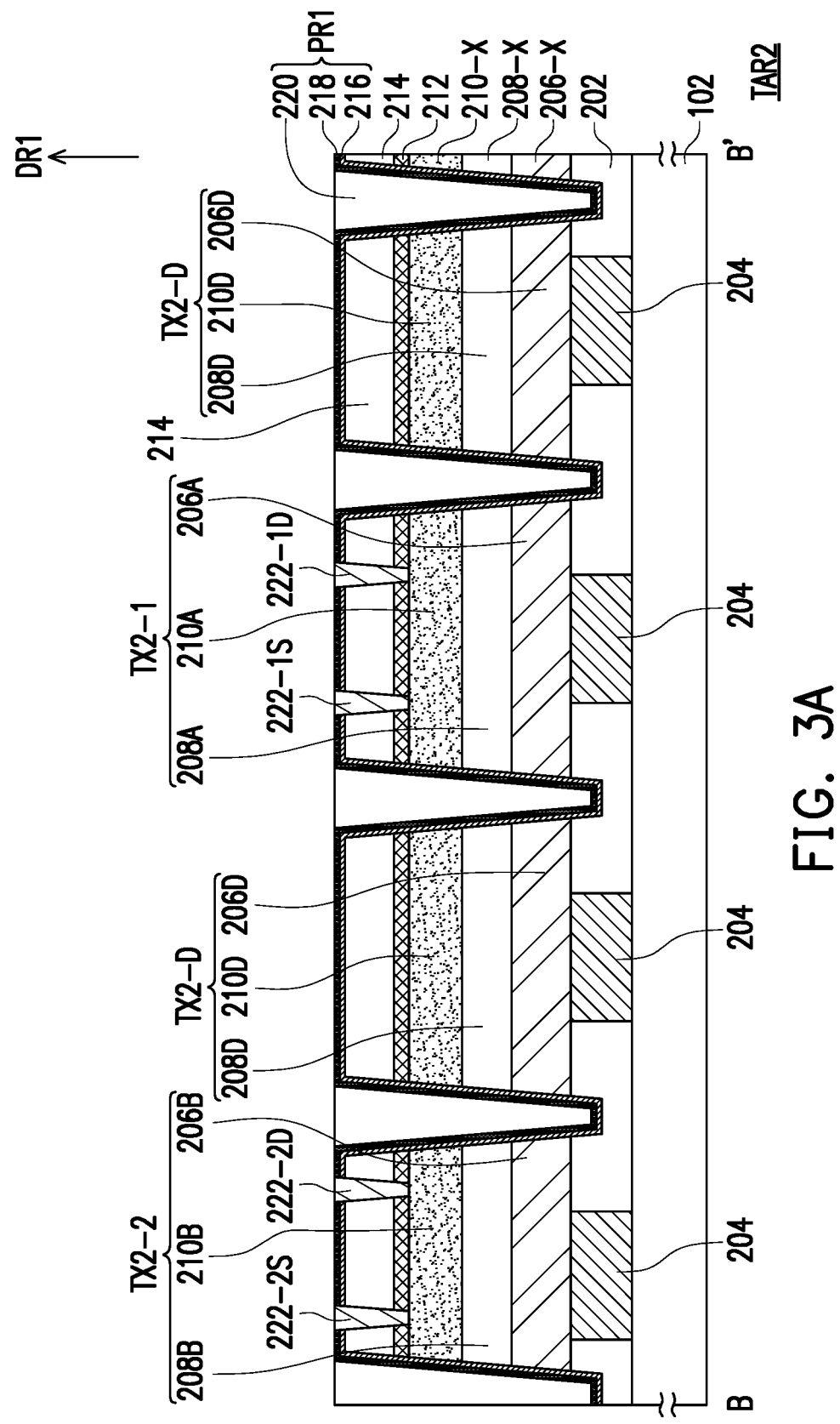
FIG. 3A and FIG. 3B are schematic cross-sectional and top views of a transistor array in the semiconductor device shown in FIG. 1 according to some other embodiments of the disclosure.
Figure 3B:
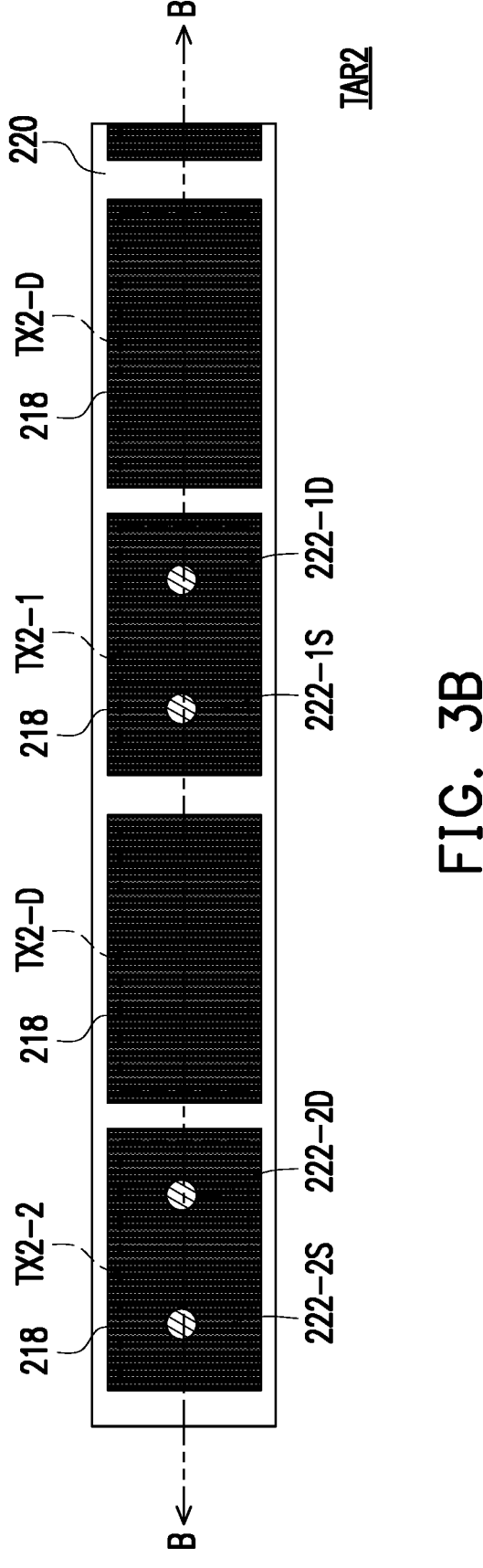

FIG. 3A and FIG. 3B are schematic cross-sectional and top views of a transistor array in the semiconductor device shown in FIG. 1 according to some other embodiments of the disclosure. The transistor array TAR2 illustrated in FIG. 3A and FIG. 3B is similar to the transistor array TAR1 illustrated in FIG. 2G and FIG. 2H. Therefore, the same reference numerals are used to refer to the same or liked parts, and its detailed description will be omitted herein.

FIG. 3B is a top view of the transistor array TAR2 shown in FIG. 3A, while FIG. 3A illustrates a cross-sectional view take along lines B-B' of FIG. 3B. As illustrated in FIG. 3A and FIG. 3B, the same steps described in FIG. 2A to FIG. 2F may be performed to form the source and drain material 222 over the dielectric portion 220 of the protection structure PR1. In a subsequent step, a planarization step is performed to partially remove the source and drain material 222 to form the source and drain electrodes 222-1S, 222-1D and source and drain electrodes 222-2S, 222-2D. For example, the planarization step is performed until a top surface of the second capping layer 218 is exposed. In the exemplary embodiment, the top surface of the second capping layer 218 is aligned and coplanar with top surfaces of the source and drain electrodes 222-1S, 222-1D and top surfaces of the source and drain electrodes 222-2S, 222-2D. Furthermore, the top surface of the second capping layer 218 is aligned and coplanar with a top surface of the dielectric portion 220. After forming the source and drain electrodes 222-1S, 222-1D and source and drain electrodes 222-2S, 222-2D, a transistor array TAR2 located in a semiconductor device 100 of FIG. 1 in accordance with some embodiments of the present disclosure may be accomplished.

In the transistor array TAR2 illustrated in FIG. 3A and FIG. 3B, since the gate electrodes 206A, 206B, the gate dielectrics 208A and 208B, and the channel layers 210A, 210B of the first and second transistors TX2-1, TX2-2 are formed by direct film stacking without performing planarization and lithography steps in between the film stacking steps, the gate electrodes 206A, 206B, the gate dielectrics 208A, 208B, and the channel layers 210A, 210B may have top surfaces with ideal flatness and low roughness (Ra<10

Å). Moreover, the presence of the capping layer 212 and the protection structure PR1 (including the first capping layer 216, the second capping layer 218 and the dielectric portion 220) surrounding the transistors may be used for preventing hydrogen ion intake and for blocking moisture absorption. As such, the semiconductor device 100 including the transistor array TAR2 may have improved performance.

Figure 4A:
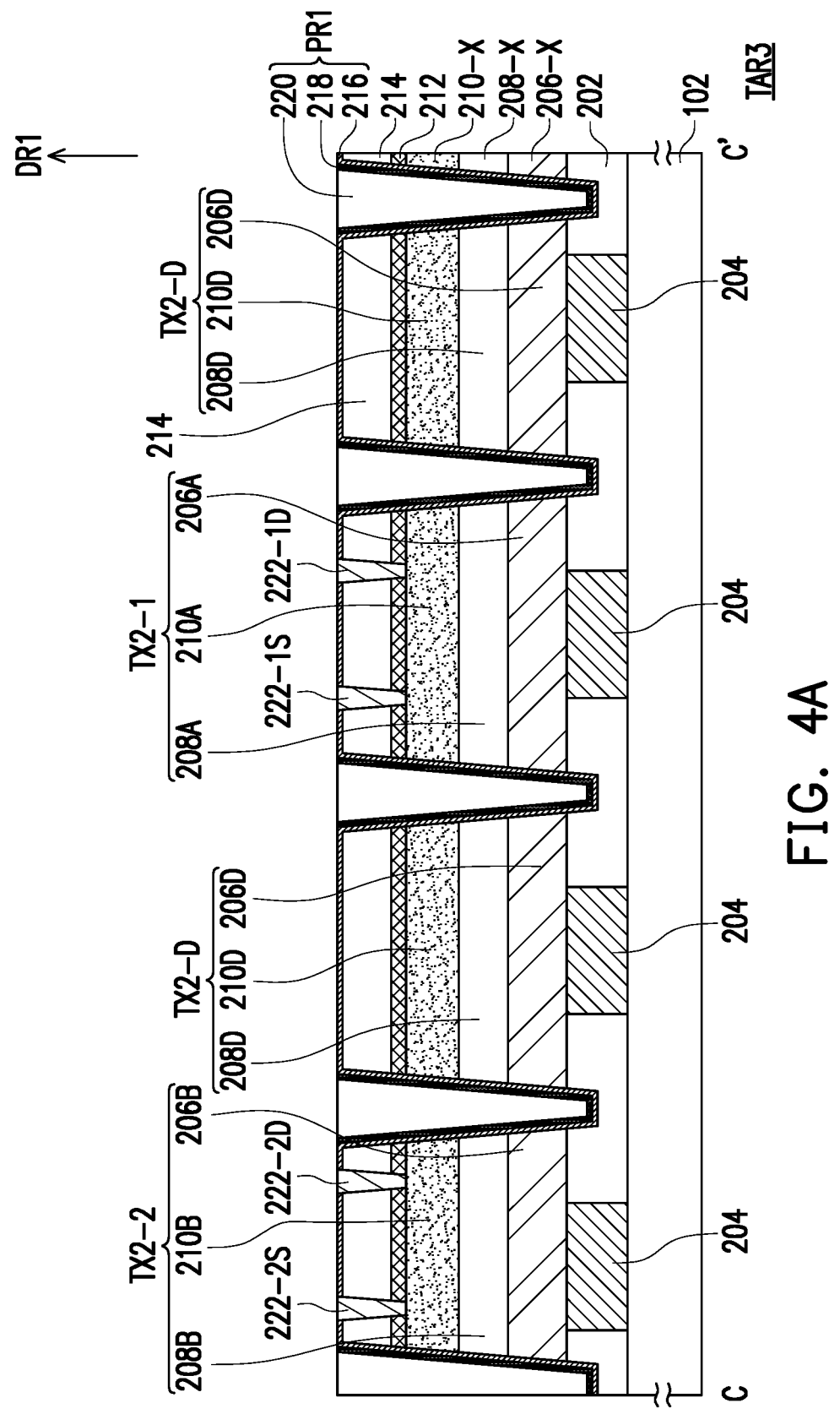
FIG. 4A and FIG. 4B are schematic cross-sectional and top views of a transistor array in the semiconductor device shown in FIG. 1 according to some other embodiments of the disclosure.
Figure 4B:
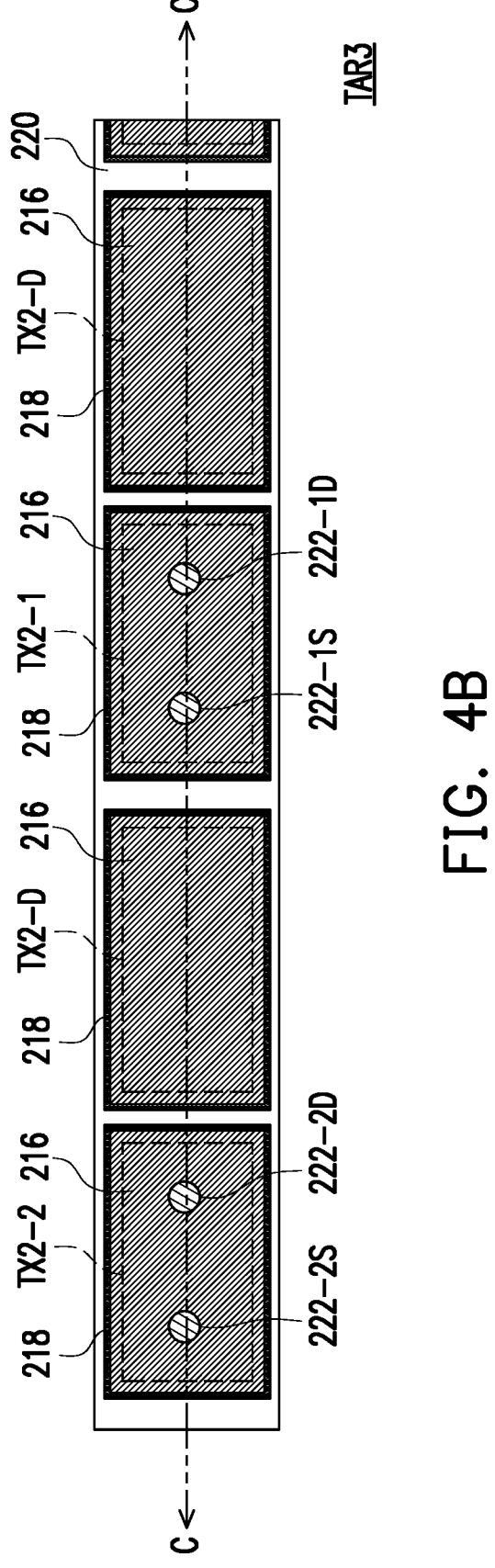

FIG. 4A and FIG. 4B are schematic cross-sectional and top views of a transistor array in the semiconductor device shown in FIG. 1 according to some other embodiments of the disclosure. The transistor array TAR3 illustrated in FIG. 4A and FIG. 4B is similar to the transistor array TAR1 illustrated in FIG. 2G and FIG. 2H. Therefore, the same reference numerals are used to refer to the same or liked parts, and its detailed description will be omitted herein.

FIG. 4B is a top view of the transistor array TAR3 shown in FIG. 4A, while FIG. 4A illustrates a cross-sectional view take along lines C-C' of FIG. 4B. As illustrated in FIG. 4A and FIG. 4B, the same steps described in FIG. 2A to FIG. 2F may be performed to form the source and drain material 222 over the dielectric portion 220 of the protection structure PR1. In a subsequent step, a planarization step is performed to partially remove the source and drain material 222 to form the source and drain electrodes 222-1S, 222-1D and source and drain electrodes 222-2S, 222-2D. For example, the planarization step is performed until a top surface of the first capping layer 216 is exposed. In the exemplary embodiment, the top surface of the first capping layer 216 is aligned and coplanar with top surfaces of the source and drain electrodes 222-1S, 222-1D and top surfaces of the source and drain electrodes 222-2S, 222-2D. Furthermore, the top surface of the first capping layer 216 is aligned and coplanar with a top surface of the second capping layer 218, and is aligned and coplanar with a top surface of the dielectric portion 220. After forming the source and drain electrodes 222-1S, 222-1D and source and drain electrodes 222-2S, 222-2D, a transistor array TAR3 located in a semiconductor device 100 of FIG. 1 in accordance with some embodiments of the present disclosure may be accomplished.

In the transistor array TAR3 illustrated in FIG. 4A and FIG. 4B, since the gate electrodes 206A, 206B, the gate dielectrics 208A and 208B, and the channel layers 210A, 210B of the first and second transistors TX2-1, TX2-2 are formed by direct film stacking without performing planarization and lithography steps in between the film stacking steps, the gate electrodes 206A, 206B, the gate dielectrics 208A, 208B, and the channel layers 210A, 210B may have top surfaces with ideal flatness and low roughness (Ra<10 Å). Moreover, the presence of the capping layer 212 and the protection structure PR1 (including the first capping layer 216, the second capping layer 218 and the dielectric portion 220) surrounding the transistors may be used for preventing hydrogen ion intake and for blocking moisture absorption. As such, the semiconductor device 100 including the transistor array TAR3 may have improved performance.

Figure 5A:
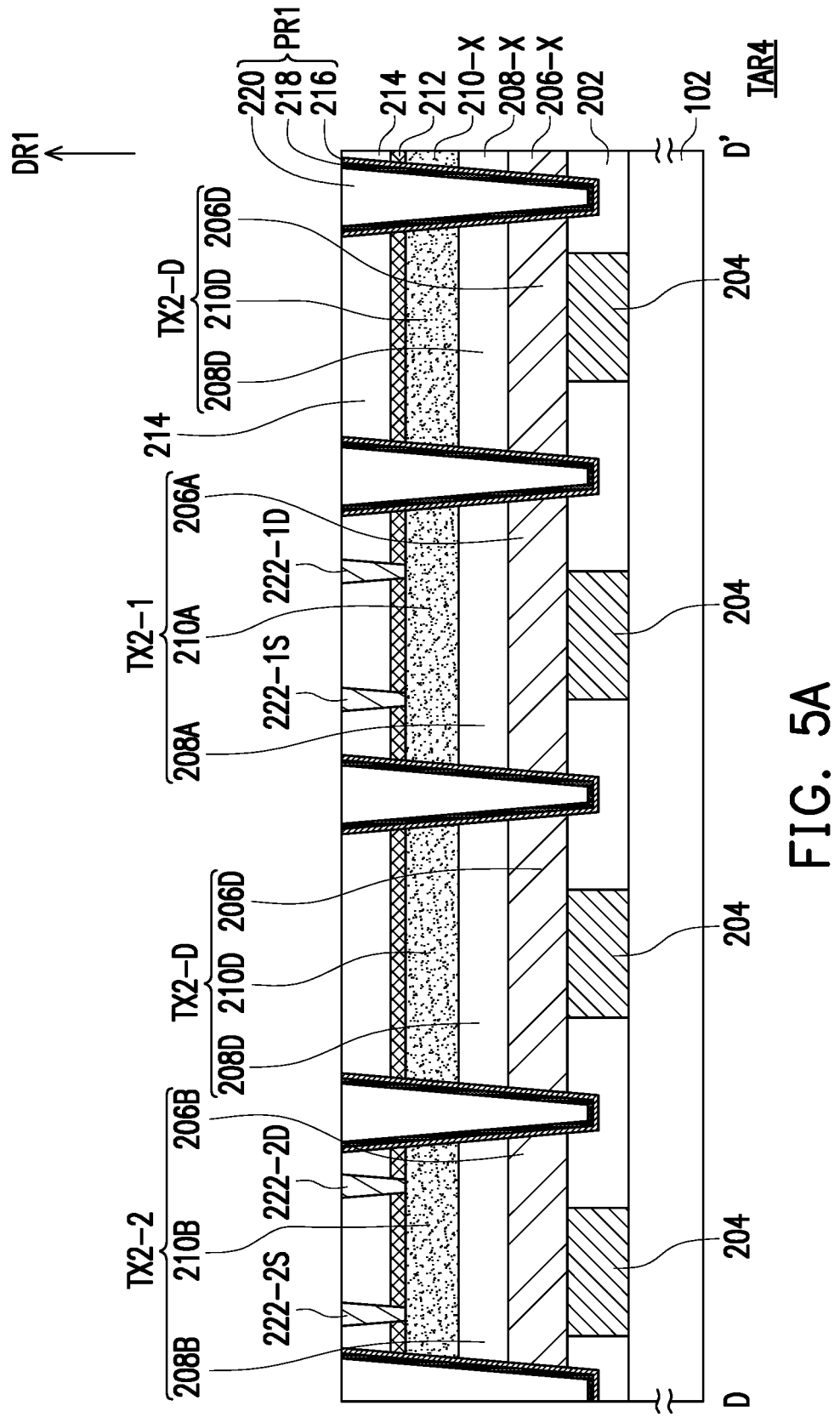
FIG. 5A and FIG. 5B are schematic cross-sectional and top views of a transistor array in the semiconductor device shown in FIG. 1 according to some other embodiments of the disclosure.
Figure 5B:
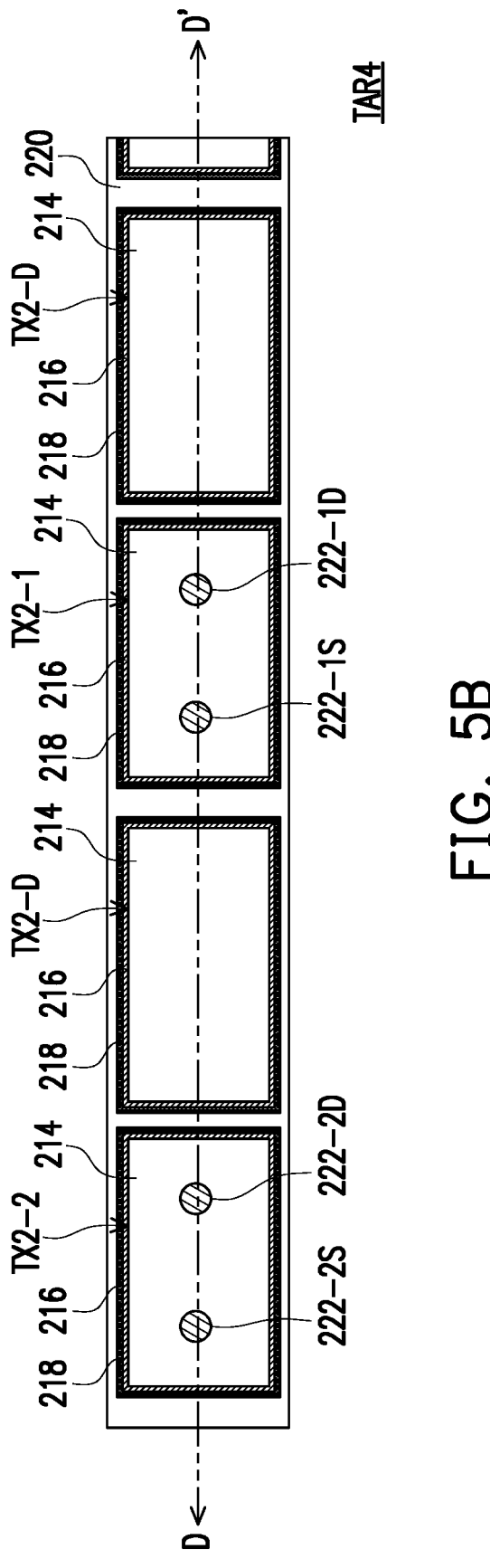

FIG. 5A and FIG. 5B are schematic cross-sectional and top views of a transistor array in the semiconductor device shown in FIG. 1 according to some other embodiments of the disclosure. The transistor array TAR4 illustrated in FIG. 5A and FIG. 5B is similar to the transistor array TAR1 illustrated in FIG. 2G and FIG. 2H. Therefore, the same reference numerals are used to refer to the same or liked parts, and its detailed description will be omitted herein.

FIG. 5B is a top view of the transistor array TAR4 shown in FIG. 5A, while FIG. 5A illustrates a cross-sectional view take along lines D-D' of FIG. 5B. As illustrated in FIG. 5A and FIG. 5B, the same steps described in FIG. 2A to FIG. 2F may be performed to form the source and drain material 222 over the dielectric portion 220 of the protection structure PR1. In a subsequent step, a planarization step is performed to partially remove the source and drain material 222 to form the source and drain electrodes 222-1S, 222-1D and source and drain electrodes 222-2S, 222-2D. For example, the planarization step is performed until a top surface of the dielectric layer 214 is exposed. In other words, the dielectric layer 214 may be partially removed through the planarization step. In the exemplary embodiment, after the planarization step, the top surface of the dielectric layer 214 is aligned and coplanar with top surfaces of the source and drain electrodes 222-1S, 222-1D and top surfaces of the source and drain electrodes 222-2S, 222-2D. Furthermore, the top surface of the dielectric layer 214 is aligned and coplanar with top surfaces of the first capping layer 216 and second capping layer 218, and is aligned and coplanar with a top surface of the dielectric portion 220. After forming the source and drain electrodes 222-1S, 222-1D and source and drain electrodes 222-2S, 222-2D, a transistor array TAR4 located in a semiconductor device 100 of FIG. 1 in accordance with some embodiments of the present disclosure may be accomplished.

In the transistor array TAR4 illustrated in FIG. 5A and FIG. 5B, since the gate electrodes 206A, 206B, the gate dielectrics 208A and 208B, and the channel layers 210A, 210B of the first and second transistors TX2-1, TX2-2 are formed by direct film stacking without performing planarization and lithography steps in between the film stacking steps, the gate electrodes 206A, 206B, the gate dielectrics 208A, 208B, and the channel layers 210A, 210B may have top surfaces with ideal flatness and low roughness (Ra<10 Å). Moreover, the presence of the capping layer 212 and the protection structure PR1 (including the first capping layer 216, the second capping layer 218 and the dielectric portion 220) surrounding the transistors may be used for preventing hydrogen ion intake and for blocking moisture absorption. As such, the semiconductor device 100 including the transistor array TAR4 may have improved performance.

Figure 6A:
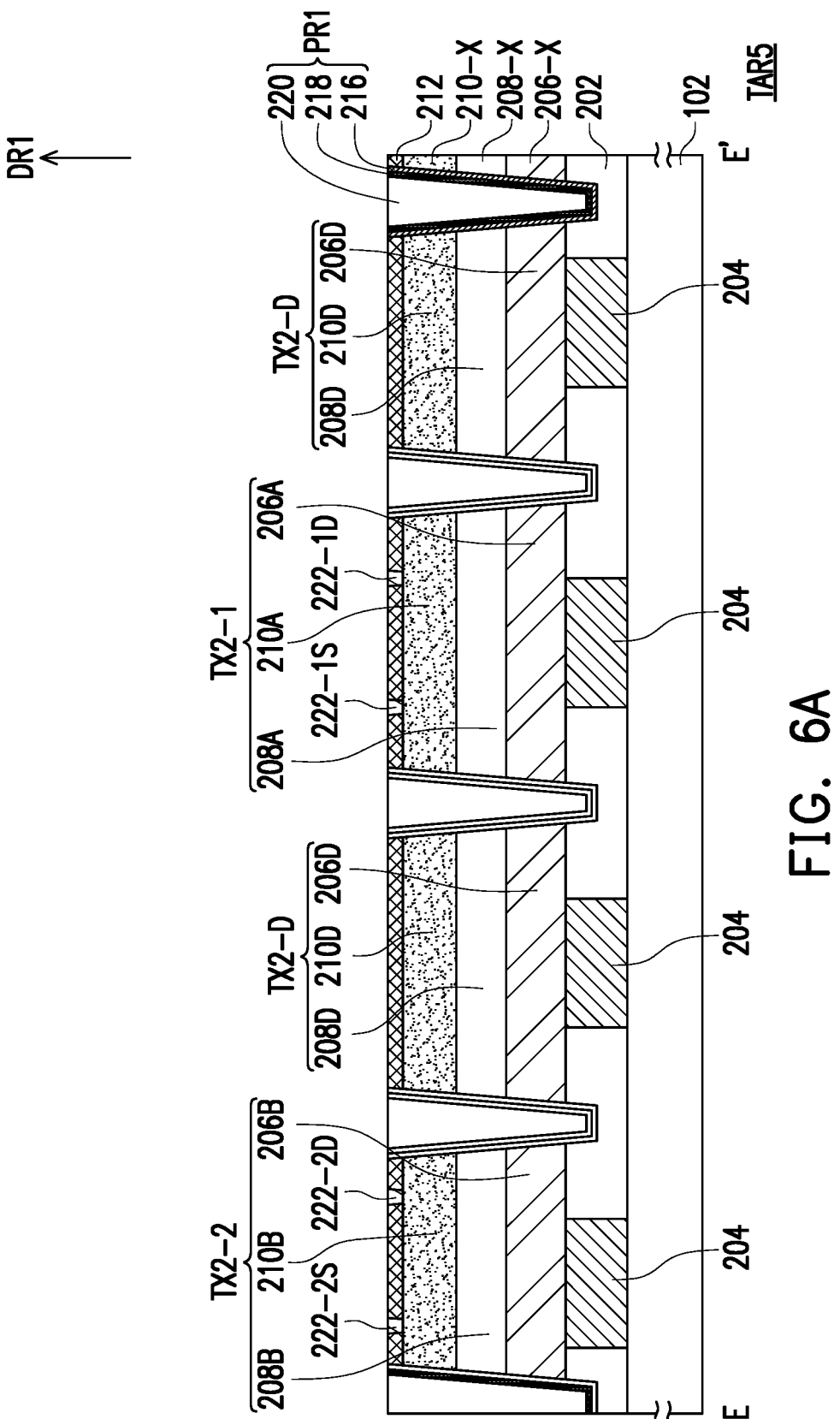
FIG. 6A and FIG. 6B are schematic cross-sectional and top views of a transistor array in the semiconductor device shown in FIG. 1 according to some other embodiments of the disclosure.
Figure 6B:
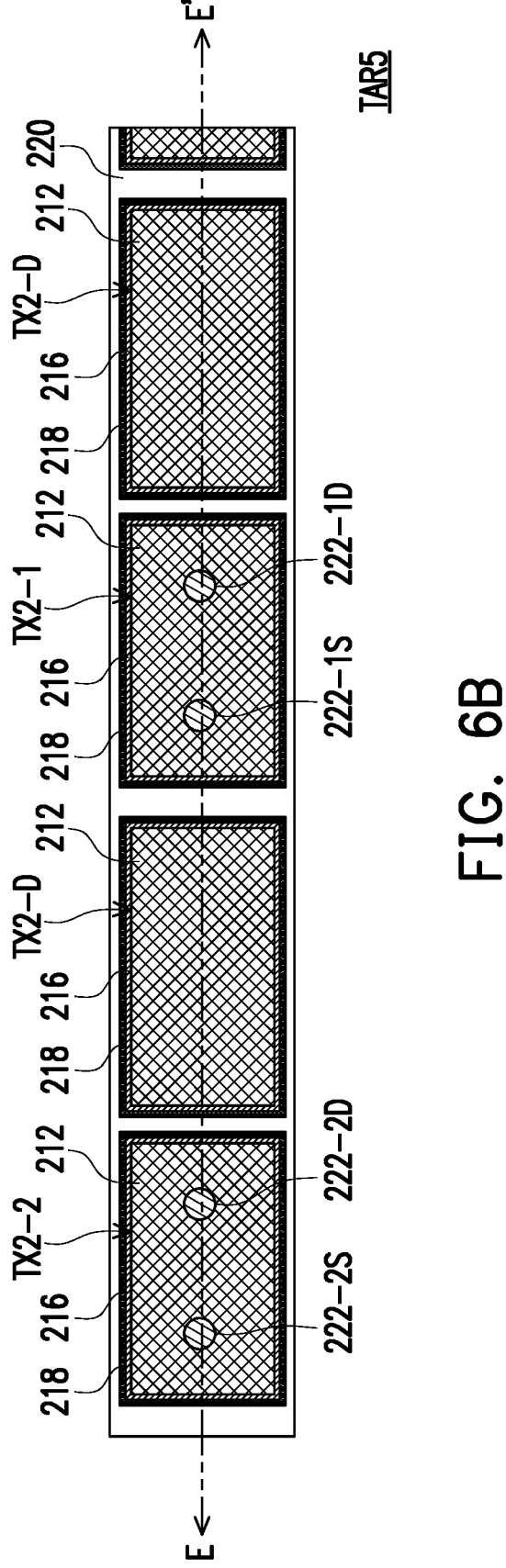

FIG. 6A and FIG. 6B are schematic cross-sectional and top views of a transistor array in the semiconductor device shown in FIG. 1 according to some other embodiments of the disclosure. The transistor array TAR5 illustrated in FIG. 6A and FIG. 6B is similar to the transistor array TAR1 illustrated in FIG. 2G and FIG. 2H. Therefore, the same reference numerals are used to refer to the same or liked parts, and its detailed description will be omitted herein.

FIG. 6B is a top view of the transistor array TAR5 shown in FIG. 6A, while FIG. 6A illustrates a cross-sectional view take along lines E-E' of FIG. 6B. As illustrated in FIG. 6A and FIG. 6B, the same steps described in FIG. 2A to FIG. 2F may be performed to form the source and drain material 222 over the dielectric portion 220 of the protection structure PR1. In a subsequent step, a planarization step is performed to partially remove the source and drain material 222 to form the source and drain electrodes 222-1S, 222-1D and source and drain electrodes 222-2S, 222-2D. For example, the planarization step is performed until a top surface of the capping layer 212 is exposed. In other words, the dielectric layer 214 may be completely removed through the planarization step. In the exemplary embodiment, after the planarization step, the top surface of the capping layer 212 is aligned and coplanar with top surfaces of the source and drain electrodes 222-1S, 222-1D and top surfaces of the source and drain electrodes 222-2S, 222-2D. Furthermore, the top surface of the capping layer 212 is aligned and coplanar with top surfaces of the first capping layer 216 and second capping layer 218, and is aligned and coplanar with a top surface of the dielectric portion 220. After forming the source and drain electrodes 222-1S, 222-1D and source and drain electrodes 222-2S, 222-2D, a transistor array TAR5 located in a semiconductor device 100 of FIG. 1 in accordance with some embodiments of the present disclosure may be accomplished.

In the transistor array TAR5 illustrated in FIG. 6A and FIG. 6B, since the gate electrodes 206A, 206B, the gate dielectrics 208A and 208B, and the channel layers 210A, 210B of the first and second transistors TX2-1, TX2-2 are formed by direct film stacking without performing planarization and lithography steps in between the film stacking steps, the gate electrodes 206A, 206B, the gate dielectrics 208A, 208B, and the channel layers 210A, 210B may have top surfaces with ideal flatness and low roughness (Ra<10 Å). Moreover, the presence of the capping layer 212 and the protection structure PR1 (including the first capping layer 216, the second capping layer 218 and the dielectric portion 220) surrounding the transistors may be used for preventing hydrogen ion intake and for blocking moisture absorption. As such, the semiconductor device 100 including the transistor array TAR5 may have improved performance.

Figure 7:
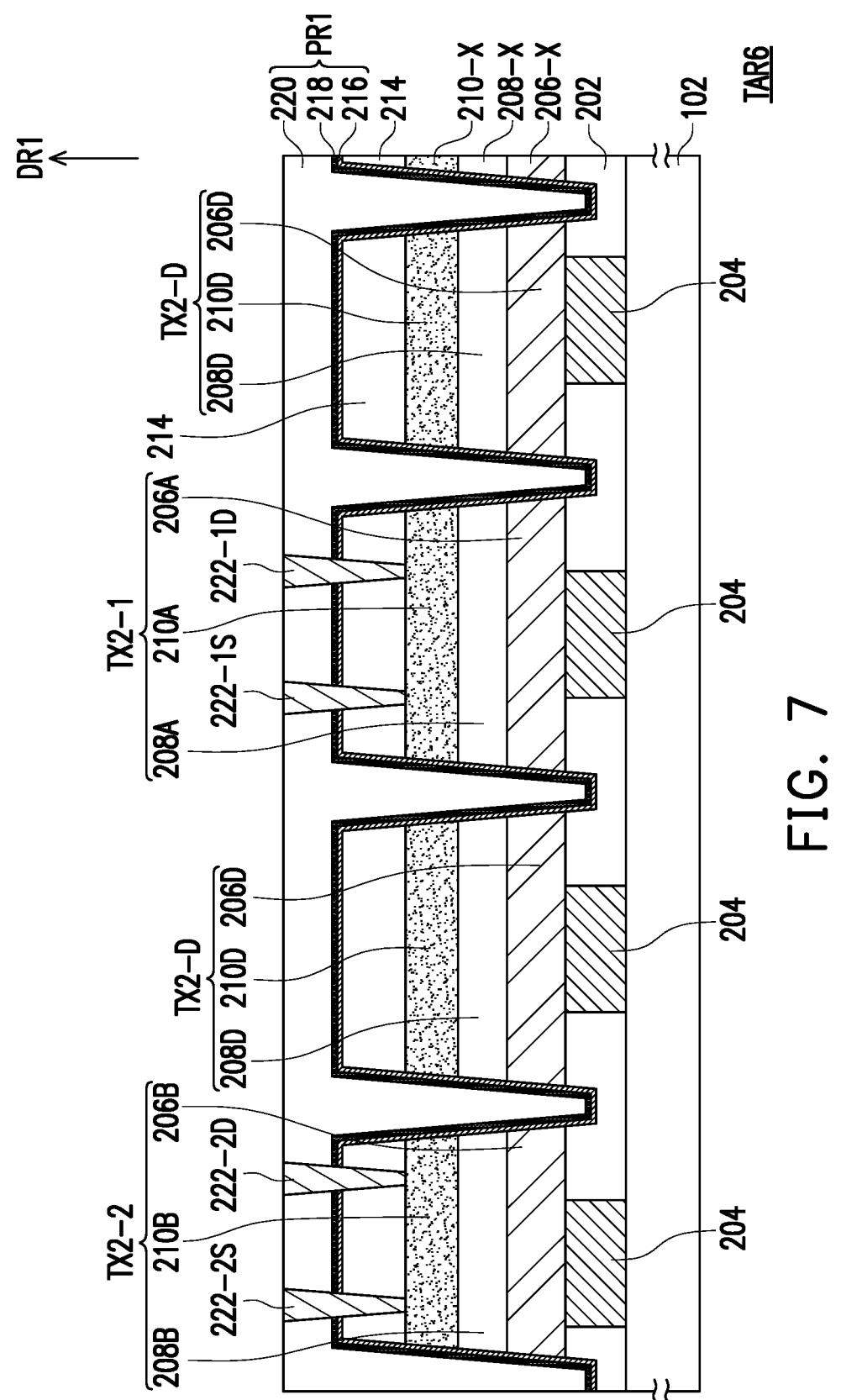
FIG. 7 is a schematic cross-sectional view of a transistor array in the semiconductor device shown in FIG. 1 according to some other embodiments of the disclosure.

FIG. 7 is a schematic cross-sectional view of a transistor array in the semiconductor device shown in FIG. 1 according to some other embodiments of the disclosure. The transistor array TAR6 illustrated in FIG. 7 is similar to the transistor array TAR1 illustrated in FIG. 2G. Therefore, the same reference numerals are used to refer to the same or liked parts, and its detailed description will be omitted herein. The difference between the embodiments is that the capping layer 212 may be further removed from the transistor array TAR6. In other words, the capping layer 212 is an auxiliary capping layer that be omitted from the transistor arrays TAR1~TAR5 based on product requirements.

In the transistor array TAR6 illustrated in FIG. 7, since the gate electrodes 206A, 206B, the gate dielectrics 208A and 208B, and the channel layers 210A, 210B of the first and second transistors TX2-1, TX2-2 are formed by direct film stacking without performing planarization and lithography steps in between the film stacking steps, the gate electrodes 206A, 206B, the gate dielectrics 208A, 208B, and the channel layers 210A, 210B may have top surfaces with ideal flatness and low roughness (Ra<10 Å). Moreover, the presence of the protection structure PR1 (including the first capping layer 216, the second capping layer 218 and the dielectric portion 220) surrounding the transistors may be used for preventing hydrogen ion intake and for blocking moisture absorption. As such, the semiconductor device 100 including the transistor array TAR6 may have improved performance.

Figure 8:
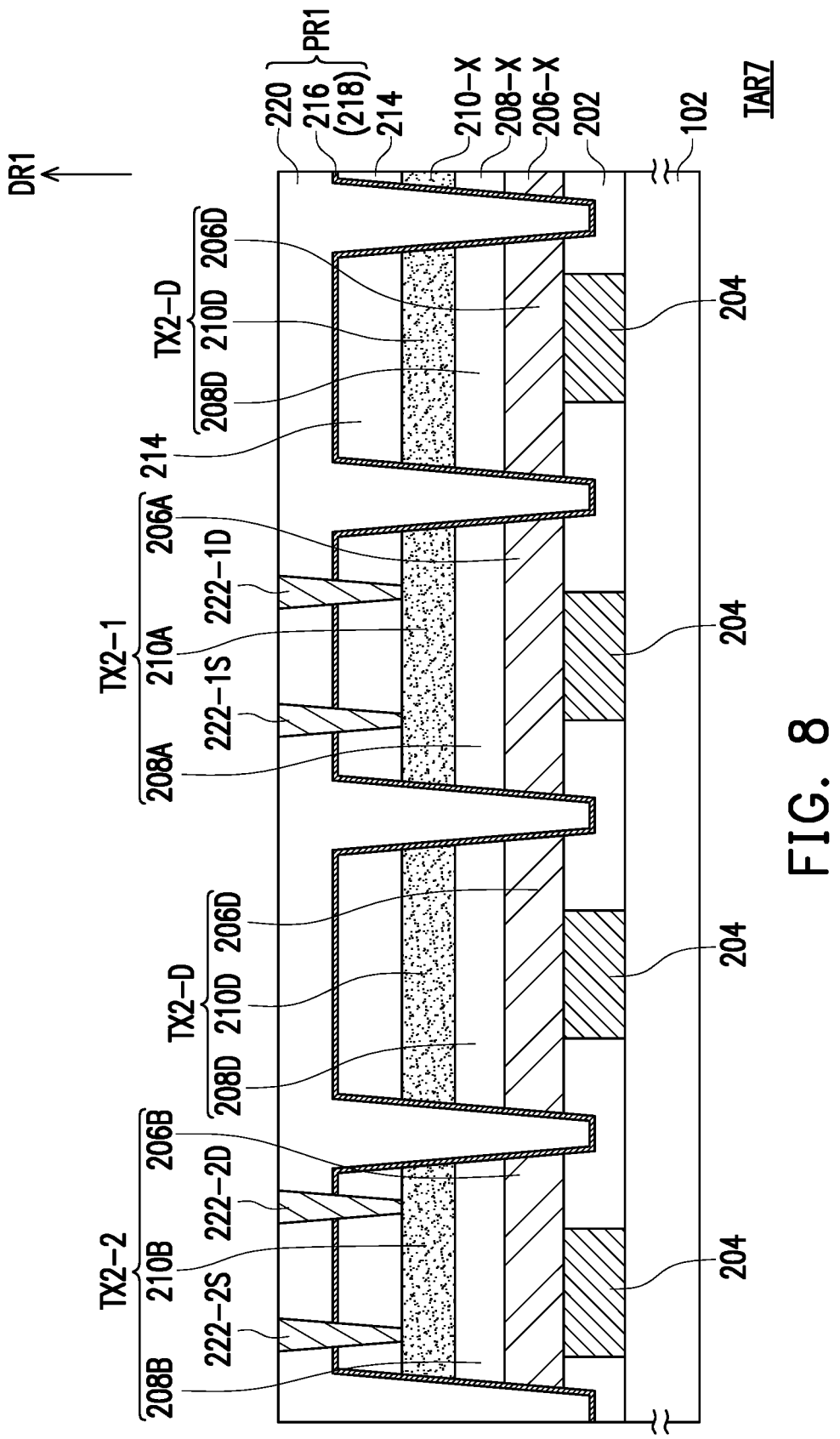
FIG. 8 is a schematic cross-sectional view of a transistor array in the semiconductor device shown in FIG. 1 according to some other embodiments of the disclosure.

FIG. 8 is a schematic cross-sectional view of a transistor array in the semiconductor device shown in FIG. 1 according to some other embodiments of the disclosure. The transistor array TAR7 illustrated in FIG. 8 is similar to the transistor array TAR1 illustrated in FIG. 2G. Therefore, the same reference numerals are used to refer to the same or liked parts, and its detailed description will be omitted herein. The difference between the embodiments is that the capping layer 212 and the second capping layer 218 (or first capping layer 216) may be further removed from the transistor array TAR7. In other words, the capping layer 212 is an auxiliary capping layer that be omitted from the transistor arrays TAR1~TAR5 based on product requirements. Furthermore, the protection structure PR1 may include any one of the first capping layer 216 or the second capping layer 218 in the protection structure PR1. In other words, any one of the first capping layer 216 or the second capping layer 218 may be retained in the protection structure PR1, while the other one of the first capping layer 216 or the second capping layer 218 may be omitted from the transistor arrays TAR1~TAR5 based on product requirements.

In the transistor array TAR7 illustrated in FIG. 8, since the gate electrodes 206A, 206B, the gate dielectrics 208A and 208B, and the channel layers 210A, 210B of the first and second transistors TX2-1, TX2-2 are formed by direct film stacking without performing planarization and lithography steps in between the film stacking steps, the gate electrodes 206A, 206B, the gate dielectrics 208A, 208B, and the channel layers 210A, 210B may have top surfaces with ideal flatness and low roughness (Ra<10 Å). Moreover, the presence of the protection structure PR1 (including the first capping layer 216 or the second capping layer 218, and the dielectric portion 220) surrounding the transistors may be used for preventing hydrogen ion intake and for blocking moisture absorption. As such, the semiconductor device 100 including the transistor array TAR7 may have improved performance.

Figure 9:
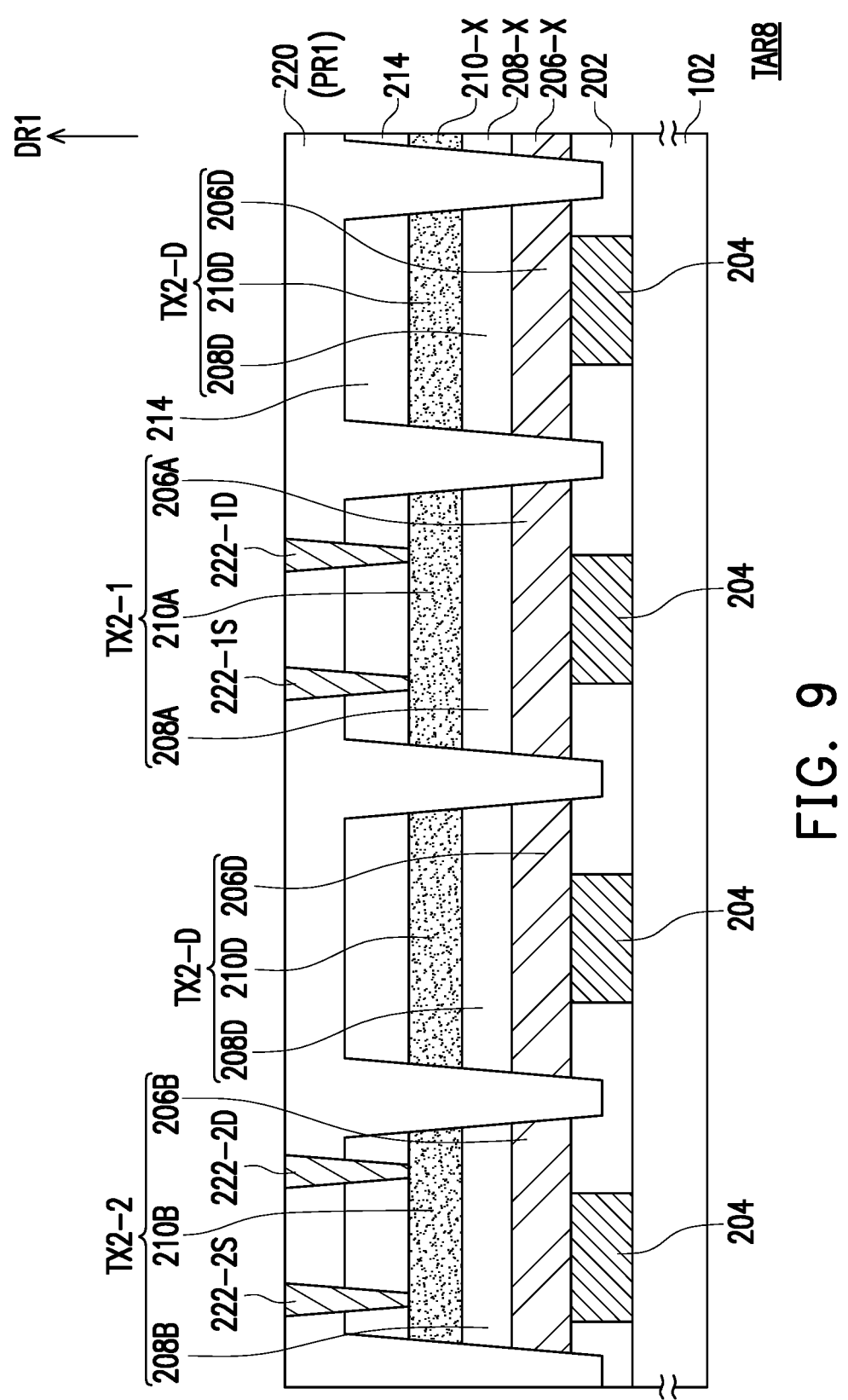
FIG. 9 is a schematic cross-sectional view of a transistor array in the semiconductor device shown in FIG. 1 according to some other embodiments of the disclosure.

FIG. 9 is a schematic cross-sectional view of a transistor array in the semiconductor device shown in FIG. 1 according to some other embodiments of the disclosure. The transistor array TAR8 illustrated in FIG. 9 is similar to the transistor array TAR7 illustrated in FIG. 8. Therefore, the same reference numerals are used to refer to the same or liked parts, and its detailed description will be omitted herein. The difference between the embodiments is that the first capping layer 216 (or the second capping layer 218) is further removed. In other words, only the dielectric portion 220 is used as the protection structure PR1.

In the transistor array TAR8 illustrated in FIG. 9, since the gate electrodes 206A, 206B, the gate dielectrics 208A and 208B, and the channel layers 210A, 210B of the first and second transistors TX2-1, TX2-2 are formed by direct film stacking without performing planarization and lithography steps in between the film stacking steps, the gate electrodes 206A, 206B, the gate dielectrics 208A, 208B, and the channel layers 210A, 210B may have top surfaces with ideal flatness and low roughness (Ra<10 Å). As such, the semiconductor device 100 including the transistor array TAR8 may have improved performance.

Figure 10:
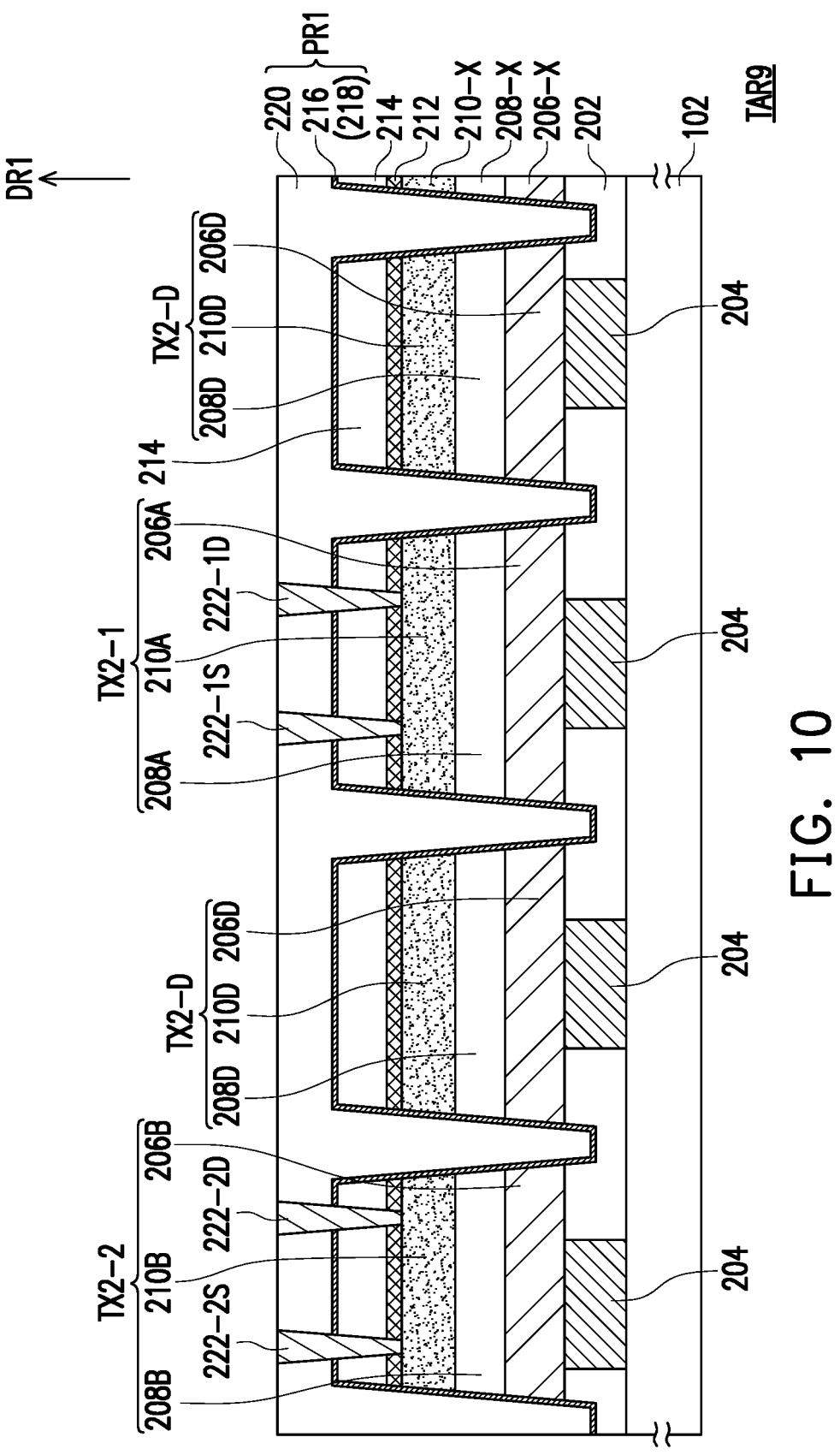
FIG. 10 is a schematic cross-sectional view of a transistor array in the semiconductor device shown in FIG. 1 according to some other embodiments of the disclosure.

FIG. 10 is a schematic cross-sectional view of a transistor array in the semiconductor device shown in FIG. 1 according to some other embodiments of the disclosure. The transistor array TAR9 illustrated in FIG. 10 is similar to the transistor array TAR1 illustrated in FIG. 2G. Therefore, the same reference numerals are used to refer to the same or liked parts, and its detailed description will be omitted herein. The difference between the embodiments is that the second capping layer 218 (or first capping layer 216) may be further removed from the transistor array TAR9. In other words, any one of the first capping layer 216 or the second capping layer 218 may be retained in the protection structure PR1, while the other one of the first capping layer 216 or the second capping layer 218 may be omitted from the transistor arrays TAR1~TAR5 based on product requirements.

In the transistor array TAR9 illustrated in FIG. 10, since the gate electrodes 206A, 206B, the gate dielectrics 208A and 208B, and the channel layers 210A, 210B of the first and second transistors TX2-1, TX2-2 are formed by direct film stacking without performing planarization and lithography steps in between the film stacking steps, the gate electrodes 206A, 206B, the gate dielectrics 208A, 208B, and the channel layers 210A, 210B may have top surfaces with ideal flatness and low roughness (Ra<10 Å). Moreover, the presence of the capping layer 212 and the protection structure PR1 (including the first capping layer 216 or the second capping layer 218, and the dielectric portion 220) surrounding the transistors may be used for preventing hydrogen ion intake and for blocking moisture absorption. As such, the semiconductor device 100 including the transistor array TAR9 may have improved performance.

Figure 11:
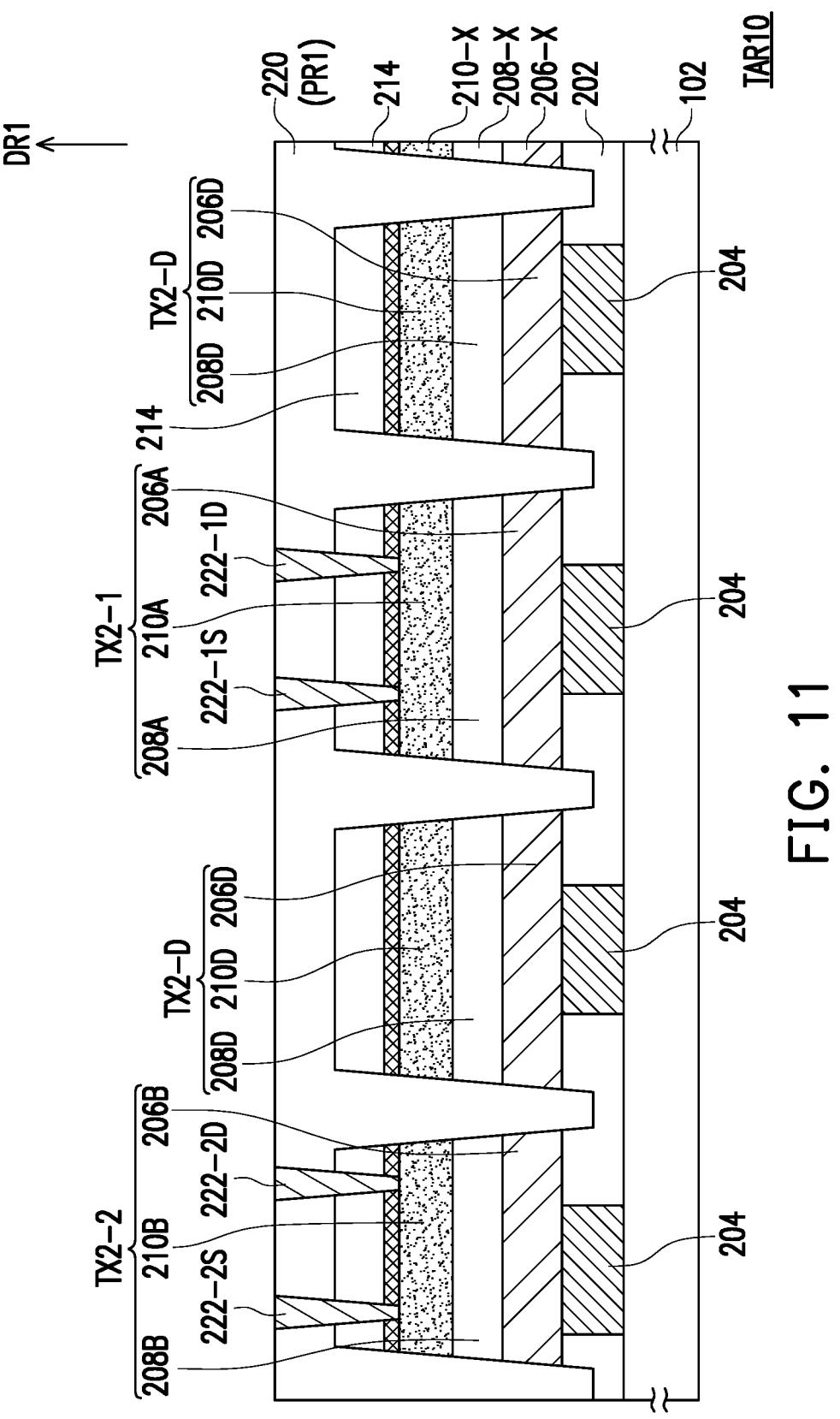
FIG. 11 is a schematic cross-sectional view of a transistor array in the semiconductor device shown in FIG. 1 according to some other embodiments of the disclosure.

FIG. 11 is a schematic cross-sectional view of a transistor array in the semiconductor device shown in FIG. 1 according to some other embodiments of the disclosure. The transistor array TAR10 illustrated in FIG. 11 is similar to the transistor array TAR1 illustrated in FIG. 2G. Therefore, the same reference numerals are used to refer to the same or liked parts, and its detailed description will be omitted herein. The difference between the embodiments is that the first capping layer 216 and the second capping layer 218 may be further removed from the transistor array TAR10. In other words, both the first capping layer 216 and the second capping layer 218 may be optionally removed from the transistor arrays TAR1~TAR5 based on product requirements.

In the transistor array TAR10 illustrated in FIG. 11, since the gate electrodes 206A, 206B, the gate dielectrics 208A and 208B, and the channel layers 210A, 210B of the first and second transistors TX2-1, TX2-2 are formed by direct film stacking without performing planarization and lithography steps in between the film stacking steps, the gate electrodes 206A, 206B, the gate dielectrics 208A, 208B, and the channel layers 210A, 210B may have top surfaces with ideal flatness and low roughness (Ra<10 Å). Moreover, the presence of the capping layer 212 surrounding the transistors may be used for preventing hydrogen ion intake and for blocking moisture absorption. As such, the semiconductor device 100 including the transistor array TAR10 may have improved performance.

In the above-mentioned embodiments, the semiconductor device includes at least a first transistor having a gate electrode, a gate dielectric, and a channel layer formed by direct film stacking. Furthermore, the gate electrode, the gate dielectric, and the channel layer are only patterned after the stacking of these layers are completed. As such, the gate electrode, the gate dielectric, and the channel layer may have top surfaces with ideal flatness and low roughness (Ra<10 Å). Furthermore, there is no need to pattern the gate electrode, the gate dielectric, and the channel layer separately, which reduces the number of patterning steps required. Moreover, the presence of a protection structure or capping layers may be used for preventing hydrogen ion intake and for blocking moisture absorption. As such, a semiconductor device including such a transistor in the transistor array may have improved performance.

In accordance with some embodiments of the present disclosure, a semiconductor device includes a first transistor and a protection structure. The first transistor includes a gate electrode, a gate dielectric disposed on the gate electrode, and a channel layer disposed on the gate dielectric. The protection structure is laterally surrounding the gate electrode, the gate dielectric and the channel layer of the first transistor. The protection structure includes a first capping layer and a dielectric portion. The first capping layer is laterally surrounding and contacting the gate electrode, the gate dielectric and the channel layer of the first transistor. The dielectric portion is disposed on the first capping layer and laterally surrounding the first transistor.

In accordance with some other embodiments of the present disclosure, a semiconductor device includes a substrate, an interconnection layer, and a transistor array. The interconnection layer is disposed on the substrate, wherein the interconnection layer includes a plurality of dielectric layers and a plurality of conductive layers alternately stacked up along a build-up direction. The transistor array is located in between the plurality of dielectric layers of the interconnection layer and electrically connected to the plurality of conductive layers. The transistor array includes a first transistor, a dummy transistor, and a protection structure. The first transistor includes a gate electrode, a gate dielectric, a channel layer and source and drain electrodes sequentially disposed over the substrate along a build-up direction. The dummy transistor includes a dummy gate electrode, a dummy gate dielectric and a dummy channel layer sequentially disposed over the substrate along the build-up direction. The protection structure is encircling the first transistor and the dummy transistor, wherein a lateral dimension of the protection structure increases along the build-up direction.

In accordance with yet another embodiment of the present disclosure, a method of fabricating a semiconductor device is described. The method includes the following steps. A first transistor is formed over a substrate, wherein forming the first transistor includes: forming a gate electrode over the substrate; forming a gate dielectric disposed on the gate electrode; and forming a channel layer disposed on the gate dielectric. The gate electrode, the gate dielectric and the channel layer are patterned to form trenches penetrating through the gate electrode, the gate dielectric and the channel layer. A protection structure is formed in the trenches to laterally surround the gate electrode, the gate dielectric and the channel layer of the first transistor. Forming the protection structure includes: forming a first capping layer in the trenches to laterally surround and contact the gate electrode, the gate dielectric and the channel layer of the first transistor; and forming a dielectric portion on the first capping layer to fill up the trenches and to laterally surround the first transistor.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a first transistor, comprising:
        a gate electrode;
        a gate dielectric disposed on the gate electrode; and
        a channel layer disposed on the gate dielectric;
    a protection structure laterally surrounding the gate electrode, the gate dielectric and the channel layer of the first transistor, wherein the protection structure comprises:
        a first capping layer laterally surrounding and contacting the gate electrode, the gate dielectric and the channel layer of the first transistor; and
        a dielectric portion disposed on the first capping layer and laterally surrounding the first transistor;
    a contact structure located below and connected to the gate electrode; and a bottom dielectric located below the gate electrode and laterally surrounding the contact structure, wherein the protection structure partially protrudes into the bottom dielectric.

2. The semiconductor device according to claim 1, wherein the protection structure further comprises a second capping layer laterally surrounding the first transistor, and located in between the first capping layer and the dielectric portion.

3. The semiconductor device according to claim 1, wherein the first transistor further comprises:

source and drain electrodes disposed on and connected to the channel layer; and a dielectric layer surrounding the source and drain electrodes, wherein the protection structure is laterally surrounding the dielectric layer and the source and drain electrodes.

4. The semiconductor device according to claim 3, further comprising an auxiliary capping layer surrounding the source and drain electrodes, wherein the protection structure further surrounds and is in contact with the auxiliary capping layer.

5. The semiconductor device according to claim 3, wherein the protection structure extends over a top surface of the dielectric layer.

6. The semiconductor device according to claim 1, wherein sidewalls of the gate electrode are aligned with sidewalls of the gate dielectric and aligned with sidewalls of the channel layer.

7. A semiconductor device, comprising:

a substrate;

an interconnection layer disposed on the substrate, wherein the interconnection layer comprises a plurality of dielectric layers and a plurality of conductive layers alternately stacked up along a build-up direction;

a transistor array located in between the plurality of dielectric layers of the interconnection layer and electrically connected to the plurality of conductive layers, wherein the transistor array comprises:

a first transistor comprising a gate electrode, a gate dielectric, a channel layer and source and drain electrodes sequentially disposed over the substrate along the build-up direction;

a dummy transistor comprising a dummy gate electrode, a dummy gate dielectric and a dummy channel layer sequentially disposed over the substrate along the build-up direction; and a protection structure encircling the first transistor and the dummy transistor, wherein a lateral dimension of the protection structure increases along the build-up direction.

8. The semiconductor device according to claim 7, wherein the lateral dimension of the protection structure located in between the gate electrode of the first transistor and the dummy gate electrode of the dummy transistor is smaller than a maximum width of the gate electrode.

9. The semiconductor device according to claim 7, wherein the protection structure comprises:

a first capping layer laterally surrounding and contacting the gate electrode, the gate dielectric and the channel layer of the first transistor, and laterally surrounding and contacting the dummy gate electrode, the dummy gate dielectric and the dummy channel layer of the dummy transistor;

a second capping layer conformally disposed on the first capping layer; and a dielectric portion disposed on the second capping layer and surrounded by the second capping layer.

10. The semiconductor device according to claim 9, wherein the dielectric portion covers a top surface of the second capping layer, and a top surface of the dielectric portion is aligned with a top surface of the source and drain electrodes of the first transistor.

11. The semiconductor device according to claim 9, wherein the first capping layer, the second capping layer and the dielectric portion are laterally surrounding and contacting sidewalls of the source and drain electrodes of the first transistor.

12. The semiconductor device according to claim 7, wherein the first transistor further comprises an auxiliary capping layer disposed on the channel layer and surrounding the source and drain electrodes, and wherein the protection structure encircles and contacts the auxiliary capping layer.

13. The semiconductor device according to claim 7, further comprising:

a gate material portion, a gate dielectric portion disposed on the gate material portion, and a channel material portion disposed on the gate dielectric portion, wherein the gate material portion, the gate dielectric portion and the channel material portion are located at a boundary of the semiconductor device, and sidewalls of the gate material portion, the gate dielectric portion and the channel material portion are aligned with sidewalls of the substrate.

14. The semiconductor device according to claim 7, wherein the transistor array further comprises:

a second transistor comprising a second gate electrode, a second gate dielectric, a second channel layer and second source and drain electrodes sequentially disposed over the substrate along the build-up direction, wherein the dummy transistor is located in between the first transistor and the second transistor, and the protection structure further encircles the second transistor.

15. A method of fabricating a semiconductor device, comprising:

forming a first transistor over a substrate, which comprises:

forming a gate electrode over the substrate;

forming a gate dielectric disposed on the gate electrode; and forming a channel layer disposed on the gate dielectric;

patterning the gate electrode, the gate dielectric and the channel layer to form trenches penetrating through the gate electrode, the gate dielectric and the channel layer;

forming a protection structure in the trenches to laterally surround the gate electrode, the gate dielectric and the channel layer of the first transistor, wherein forming the protection structure comprises:

forming a first capping layer in the trenches to laterally surround and contact the gate electrode, the gate dielectric and the channel layer of the first transistor;

conformally forming a second capping layer over the first capping layer and in the trenches; and forming a dielectric portion on the first capping layer and over the second capping layer to fill up the trenches and to laterally surround the first transistor.

16. The method according to claim 15, wherein forming the first transistor further comprises:

forming a dielectric layer on the channel layer prior to forming the protection structure;

patterning the dielectric layer to form openings revealing the channel layer; and forming a source and drain material in the openings, wherein the source and drain material is disposed on and connected to the channel layer, and the protection structure is laterally surrounding the dielectric layer and the source and drain material.

17. The method according to claim 16, further comprising performing a planarization step to partially remove the source and drain material to form source and drain electrodes, wherein after the planarization step, a top surface of the source and drain electrodes is aligned with a top surface of the dielectric portion of the protection structure.

18. The method according to claim 16, further comprising:

forming an auxiliary capping layer on the channel layer prior to forming the dielectric layer;

forming the dielectric layer on the channel layer and over the auxiliary capping layer;

patterning the dielectric layer along with the auxiliary capping layer to form the openings revealing the channel layer; and forming the source and drain material in the openings, wherein the protection structure further surrounds and is in contact with the auxiliary capping layer.

19. The semiconductor device according to claim 1, wherein the gate electrode, the gate dielectric, and the channel layer have slanted sidewalls.

20. The method according to claim 15, further comprising:

forming a dummy transistor over the substrate and aside the first transistor, which comprises:

forming a dummy gate electrode over the substrate;

forming a dummy gate dielectric disposed on the dummy gate electrode; and forming a dummy channel layer disposed on the dummy gate dielectric, wherein the protection structure is formed in the trenches to further surround the dummy gate electrode, the dummy gate dielectric and the dummy channel layer of the dummy transistor.

* * * * *